US012131024B2

(12) United States Patent
Kanno et al.

(10) Patent No.: US 12,131,024 B2
(45) Date of Patent: *Oct. 29, 2024

(54) MEMORY SYSTEM, HOST DEVICE AND INFORMATION PROCESSING SYSTEM FOR ERROR CORRECTION PROCESSING

(71) Applicant: Kioxia Corporation, Tokyo (JP)

(72) Inventors: Shinichi Kanno, Tokyo (JP); Hiroshi Nishimura, Tokyo (JP); Hideki Yoshida, Yokohama Kanagawa (JP); Hiroshi Murayama, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/204,854

(22) Filed: Jun. 1, 2023

(65) Prior Publication Data
US 2023/0305701 A1    Sep. 28, 2023

Related U.S. Application Data

(63) Continuation of application No. 17/078,547, filed on Oct. 23, 2020, now Pat. No. 11,704,019, which is a
(Continued)

(51) Int. Cl.
*G06F 3/06* (2006.01)
*G06F 1/3234* (2019.01)
(Continued)

(52) U.S. Cl.
CPC .......... *G06F 3/0604* (2013.01); *G06F 1/3275* (2013.01); *G06F 3/0619* (2013.01);
(Continued)

(58) Field of Classification Search
CPC .... G06F 3/0604; G06F 3/0619; G06F 3/0653; G06F 3/0655; G06F 3/0659;
(Continued)

(56) References Cited

U.S. PATENT DOCUMENTS 8,402,325 B2    3/2013  Egner
8,418,042 B2    4/2013  Kanno
(Continued)

FOREIGN PATENT DOCUMENTS

JP    2014-016733 A    1/2014

OTHER PUBLICATIONS

Xiao-Yu Hu et al., "Write Amplification Analysis in Flash-Based Solid State Drives," SYSTOR '09 Proceedings of SYSTOR 2009: The Israeli Experimental Systems Conference, May 4, 2009, ACM.
(Continued)

*Primary Examiner* — Gary W. Cygiel
(74) *Attorney, Agent, or Firm* — Maier & Maier, PLLC

(57) ABSTRACT

A memory system including: a nonvolatile memory; first and second decoders configured to execute first and second error correction for correcting data read from the nonvolatile memory; and a controller configured to receive a first command issued by a host device, the first command being a command that requests neither reading nor writing data from or to the nonvolatile memory and that includes information indicative of acceptable latency of error correction, in response to receiving the first command, select one of the first decoder and the second decoder based on the received first command, and after receiving the first command, output data read from the nonvolatile memory through the selected one of the first decoder and the second decoder to the host device.

20 Claims, 19 Drawing Sheets

Related U.S. Application Data continuation of application No. 15/632,450, filed on Jun. 26, 2017, now Pat. No. 10,866,733, which is a continuation of application No. 14/817,625, filed on Aug. 4, 2015, now abandoned.

(60) Provisional application No. 62/035,243, filed on Aug. 8, 2014.

(51) Int. Cl.
| | |
|---|---|
| *G06F 11/10* | (2006.01) |
| *G06F 12/02* | (2006.01) |
| *G11C 16/04* | (2006.01) |
| *G11C 16/24* | (2006.01) |
| *G11C 29/52* | (2006.01) |
| *H03M 13/29* | (2006.01) |

(52) U.S. Cl.
CPC .......... *G06F 3/0653* (2013.01); *G06F 3/0655* (2013.01); *G06F 3/0659* (2013.01); *G06F 3/0679* (2013.01); *G06F 3/0688* (2013.01); *G06F 11/1068* (2013.01); *G11C 29/52* (2013.01); *H03M 13/2906* (2013.01); *G06F 12/0246* (2013.01); *G06F 2212/214* (2013.01); *G11C 16/0483* (2013.01); *G11C 16/24* (2013.01); *Y02D 10/00* (2018.01)

(58) Field of Classification Search
CPC .. G06F 3/0679; G06F 3/0688; G06F 12/0246; G11C 16/0483
See application file for complete search history.

(56) References Cited

U.S. PATENT DOCUMENTS

| | | | |
|---|---|---|---|
| 8,443,263 | B2 | 5/2013 | Selinger et al. |
| 8,738,994 | B2 | 5/2014 | Cho et al. |
| 2006/0053338 | A1 | 3/2006 | Cousins et al. |
| 2007/0168605 | A1 | 7/2007 | Takai et al. |
| 2008/0195900 | A1 | 8/2008 | Chang |
| 2009/0316541 | A1 | 12/2009 | Takada et al. |
| 2010/0057991 | A1 | 3/2010 | Yoshida et al. |
| 2011/0208911 | A1 | 8/2011 | Taguchi et al. |
| 2011/0314204 | A1 | 12/2011 | Ootsuka et al. |
| 2014/0013050 | A1 | 1/2014 | Matsukawa et al. |
| 2014/0101379 | A1 | 4/2014 | Tomlin |
| 2014/0195699 | A1 | 7/2014 | Sokol, Jr. et al. |
| 2014/0218767 | A1 | 8/2014 | Hamaguchi |
| 2014/0229655 | A1 | 8/2014 | Goss et al. |
| 2014/0351515 | A1 | 11/2014 | Chiu et al. |
| 2014/0379963 | A1 | 12/2014 | Kazama |
| 2017/0060208 | A1 | 3/2017 | Sawai et al. |

OTHER PUBLICATIONS

Amber Huffman, "NVM Express 1.1," Oct. 11, 2012, Intel Corporation.
International Search Report and Written Opinon issued on Nov. 2, 2015 in International Application No. PCT/IB2015/056002.
Taiwanese Office Action issued on Feb. 17, 2016 in corresponding Taiwanese application No. 103139433, along with an English translation thereof.
Final Office Action received in U.S. Appl. No. 14/921,708 dated Feb. 5, 2018.

Information processing system 100 (outline)

Information processing system 100 (exterior)

Table T1

| Storage device | Power/performance characteristic |
|---|---|
| SSD 0 | PP0 |
| SSD 1 | PP1 |
| SSD 2 | PP2 |
| SSD 3 | PP3 |
| SSD 4 | PP4 |
| SSD 5 | PP5 |
| SSD 6 | PP6 |
| SSD 7 | PP7 |
| SSD 8 | PP8 |
| SSD 9 | PP9 |

F I G. 10

Updated table T1

| Memory system | Power/performance characteristic | Corrected power/performance characteristic | Allowable power | Changed power |
|---|---|---|---|---|
| SSD 0 | PP0 | PP0' | P0" | P0" |
| SSD 1 | PP1 | PP1' | P1" | P1" |
| SSD 2 | PP2 | PP2' | P2" | P2" |
| SSD 3 | PP3 | PP3' | P3" | P3" |
| SSD 4 | PP4 | PP4' | P4" | P4" |
| SSD 5 | PP5 | PP5' | (P5) | P5" (=P5+[AP0~AP4,AP6~AP9]) |
| SSD 6 | PP6 | PP6' | P6" | P6" |
| SSD 7 | PP7 | PP7' | P7" | P7" |
| SSD 8 | PP8 | PP8' | P8" | P8" |
| SSD 9 | PP9 | PP9' | P9" | P9" |

F I G. 14

Tenth embodiment

Comparative example

Eleventh embodiment

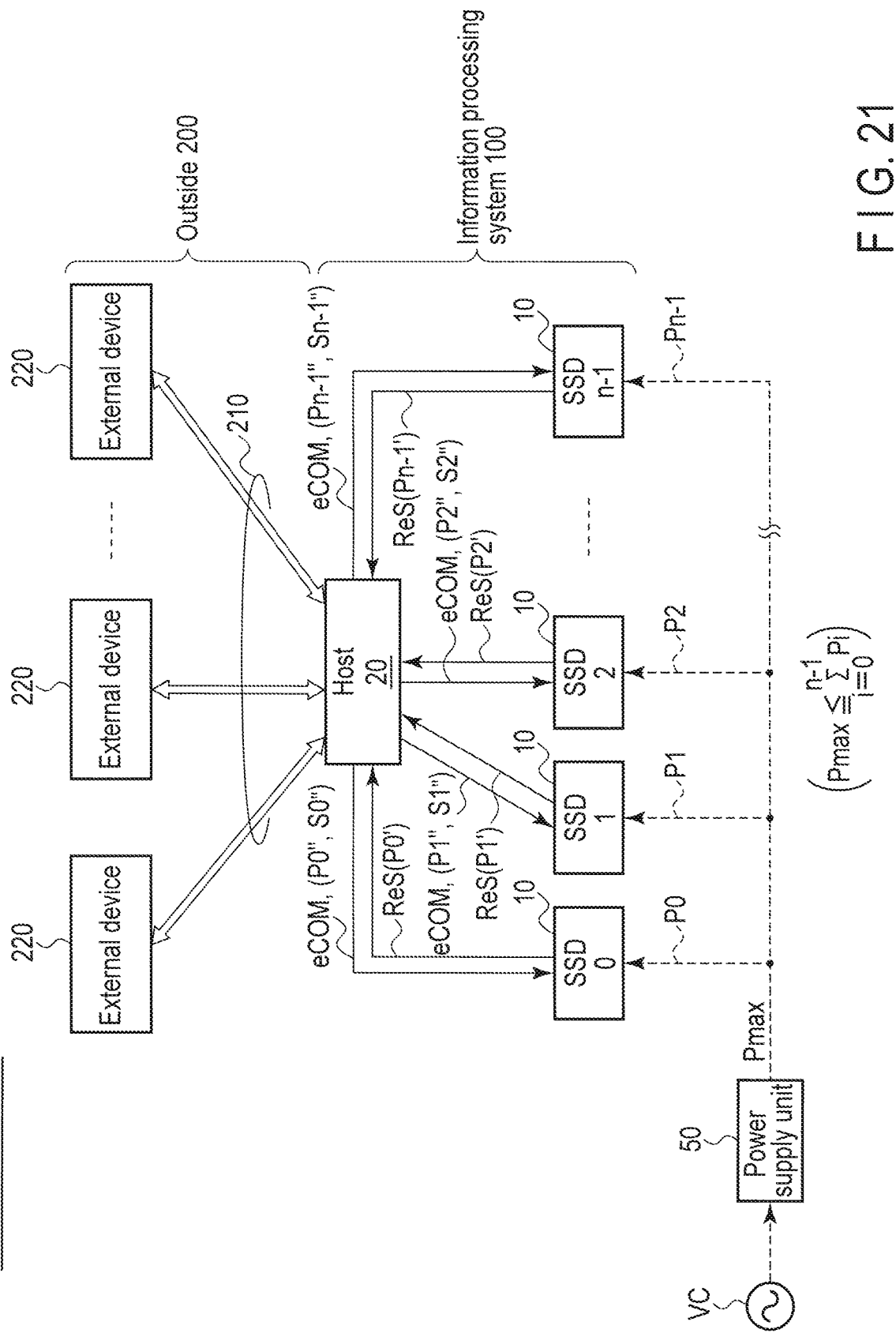
F I G. 21

Table T3 (modified example 1)

| Storage device | Log |
|---|---|
| SSD 0 | (S01, P01), (S02, P02), ... |
| SSD 1 | (S11, P11), (S12, P12), ... |
| SSD 2 | (S21, P21), (S22, P22), ... |
| SSD 3 | (S31, P31), (S32, P32), ... |
| SSD 4 | (S41, P41), (S42, P42), ... |
| SSD 5 | (S51, P51), (S52, P52), ... |
| SSD 6 | (S61, P61), (S62, P62), ... |
| SSD 7 | (S71, P71), (S72, P72), ... |
| SSD 8 | (S81, P81), (S82, P82), ... |
| SSD 9 | (S91, P91), (S92, P92), ... |

FIG. 23

MEMORY SYSTEM, HOST DEVICE AND INFORMATION PROCESSING SYSTEM FOR ERROR CORRECTION PROCESSING

CROSS-REFERENCE TO RELATED APPLICATIONS

This application is a continuation of application Ser. No. 17/078,547, filed on Oct. 23, 2020 which is a continuation of application Ser. No. 15/632,450, filed Jun. 26, 2017 (Now U.S. Pat. No. 10,866,733 issued Dec. 15, 2020), which is a continuation of application Ser. No. 14/817,625, filed Aug. 4, 2015 and is based upon and claims the benefit of U.S. Provisional Application No. 62/035,243, filed Aug. 8, 2014, the entire contents of each are incorporated herein by reference.

FIELD

Embodiments described herein relate generally to a memory system, a host device and an information processing system.

BACKGROUND

There is a solid-state drive (SSD) including a nonvolatile semiconductor memory as a storage medium and having the same interface as a hard disk drive (HDD).

BRIEF DESCRIPTION OF THE DRAWINGS

FIG. 10 is a table showing a table T1 according to the tenth embodiment.

FIG. 14 is a table showing the updated table T1.

FIG. 21 is a block diagram showing a general structure of an information processing system according to the twelfth embodiment.

FIG. 23 is a table showing a table T3 according to modified example 1.

DETAILED DESCRIPTION

Figure 1:
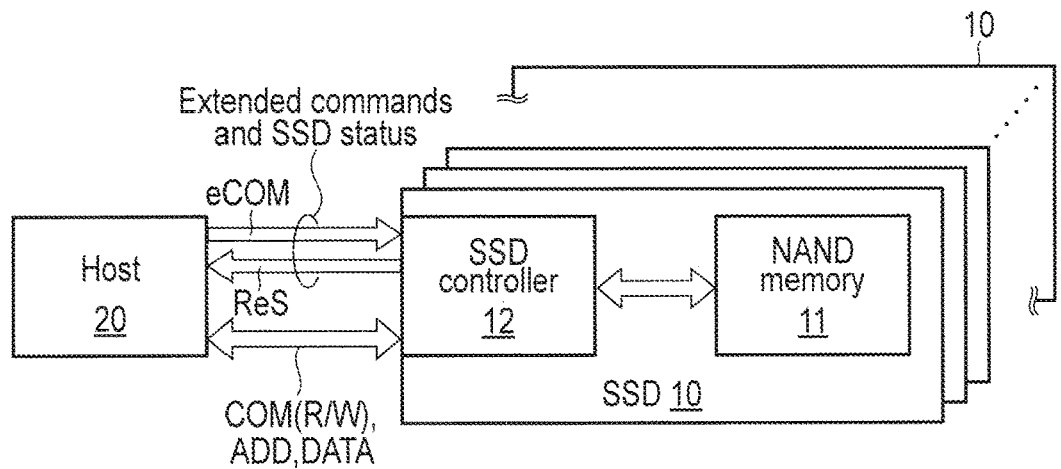
FIG. 1 is a block diagram illustrating an outline of the embodiments.

Various embodiments will be described hereinafter with reference to the accompanying drawings.

In general, according to one embodiment, a memory system includes a nonvolatile memory and a controller which controls the nonvolatile memory. The controller notifies to an outside an extensive signal which indicates a predetermined state of the nonvolatile memory or the controller.

In this specification, some components are expressed by two or more terms. These terms are merely examples and these components may be expressed by another or other terms. In addition, other components which are not expressed by two or more terms may be expressed by another or other terms.

Also, the drawings are merely examples, and may differ from when the embodiments are actually realized in terms of, for example, the relationship between thickness and planar dimension and the ratio of thickness of layers. Further, in the drawings, the relationship or ratio of dimensions may be different from figure to figure.

(Outline)

To begin with, the outline of the embodiments will be briefly described with reference to FIG. 1, before describing each embodiment. A solid-state drive (SSD) is given as an example as a memory system 10.

As shown, an information processing system 100 includes a plurality of SSDs 10 and a host device 20.

Each of the plurality of SSDs 10 includes a NAND flash memory (NAND memory) 11 and an SSD controller 12.

The NAND memory 11 is a nonvolatile memory physically including a plurality of chips (for example, five chips), although not shown. Each of the NAND memory 11 is constituted by a plurality of physical blocks having a plurality of memory cells arranged on the intersection point between a word line and a bit line. In the NAND memory 11, data is erased collectively per physical block. That is, the physical block is a unit of data erasure. Data write and data read are performed per page (word line) in each block.

The SSD controller (memory controller) 12 controls the whole operation of the SSD 10. For example, the SSD controller 12 controls access (data read, data write, data delete, etc.) to the NAND memory 11 in accordance with an instruction (request or command COM) from the host device 20.

The host device 20 transmits, for example, a read command COMR and an address ADD to each SSD 10. A control unit (for example, CPU, processor or MUP), which is not shown, of the host device 20 receives from the SSD 10 read data DATA corresponding to a request of the read command COMR.

In addition to the above-mentioned structure and operation, the following is performed in the embodiments.

Firstly, the control unit of the host device 20 issues to the SSD 10 an extensive command eCOM, which is for deliberately (intentionally) detecting various states (for example, a state of a bad block of the NAND memory 11) of the SSD 10 and is defined differently from the above-mentioned read command COMR and a write command COMW. It may not be limited to the command eCOM but may be a different extensive (or extended) predetermined signal (information, request, instruction, etc.).

Secondly, the SSD controller 12 of the SSD 10 returns its own state (SSD 10) to the host device 20 as an extensive status signal ReS, based on the received extensive command eCOM. It may not be limited to the status signal ReS but may be a different extensive (or extended) predetermined signal (information, return, response, etc.).

Therefore, the host device 20 can detect various states of the SSD 10 based on the returned extensive status signal ReS. This enables the host device 20 to improve the detected state of the SSD 10 as necessary.

Note that the above-mentioned extensive command eCOM and extensive status signal ReS may be transmitted in any order. That is, it is possible to firstly transmit an extensive predetermined signal from the SSD to the host device 20 and secondly transmit the extensive predetermined signal from the host device 20 to the SSD 10.

(Exterior)

Figure 2:
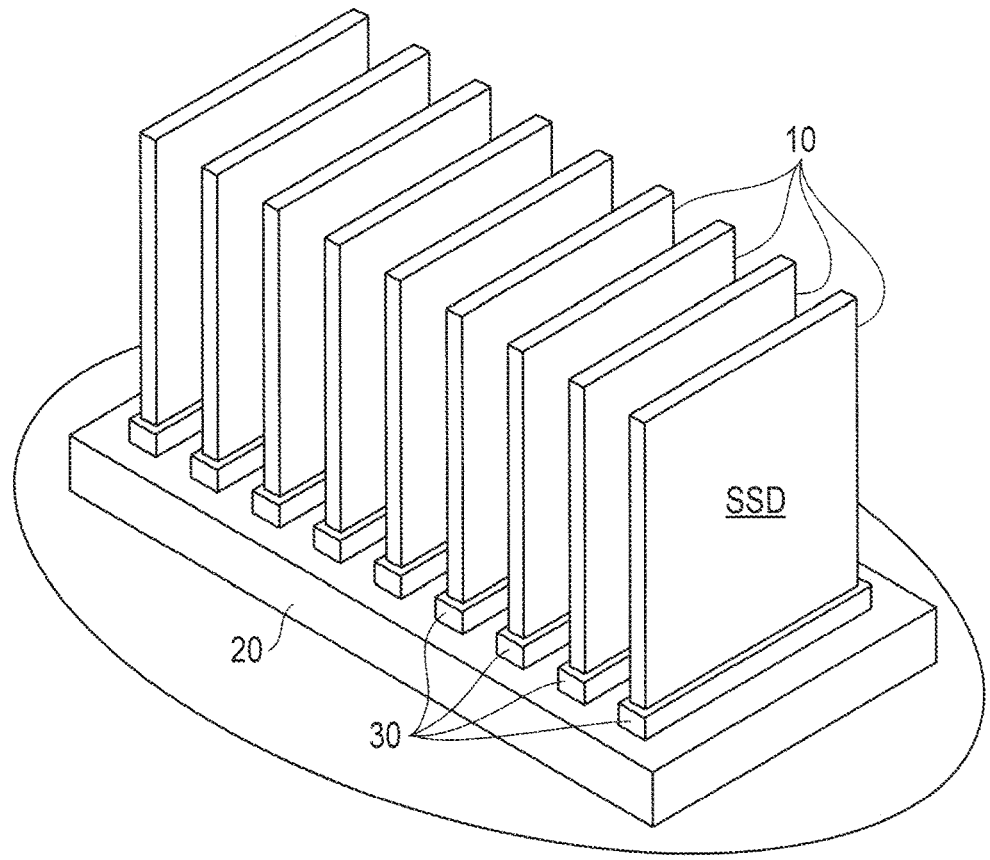
FIG. 2 is a perspective view illustrating an information processing system in FIG. 1.

Next, an exterior of the information processing system 100 will be briefly described with reference to FIG. 2, before describing each embodiment.

The SSD 10 as shown is, for example, a relatively small module, and has an outside dimension of, for example, approximately 120 mm×130 mm. Note that the size and dimension of the SSD 10 may not be limited thereto but may be appropriately modified to various ones. Also, the SSD 10 can be used by being mounted to the server-like host device 20 in, for example, a data center or a cloud computing system operated by a company (enterprise). Therefore, the SSD 10 may be an enterprise SSD (eSSD).

The host device 20 includes a plurality of connectors (for example, slots) 30 which are opened upward, for example. Each connector 30 is, for example, a serial attached SCSI (SAS) connector. This SAS connector enables the host device 20 and each SSD to perform high-speed communication with each other by means of a dual port of 6 GPBS. Note that each connector 30 may not be limited thereto but may be, for example, PCI express (PCIe) or NVM express (NVMe).

Also, the plurality of SSDs 10 are mounted to the connector 30 of the host device 20, respectively, to be supported side by side with each other in a posture of standing in a substantially vertical direction. According to such a structure, it is possible to compactly mount the plurality of SSDs 10 and to reduce the host device 20 in size. Further, each shape of the SSD 10 of the present embodiment is 2.5 inches small form factor (SFF). Such a shape makes the SSD 10 compatible with an enterprise HDD (eHDD) in shape and realizes an easy system compatibility with an eHDD.

Note that the SSD 10 is not limited for enterprise one. For example, the SSD 10 is certainly applicable as a storage medium of an electronic device for consumer such as a notebook portable computer and a tablet device.

EMBODIMENTS

Subsequently, each embodiment will be described in detail.

[1] First Embodiment (Example of Error Correction in Data Read)

To begin with, the first embodiment will be described with reference to FIG. 3. The first embodiment relates to an example of setting of reducing the time of error correction when performing data read from the SSD 10. The following gives an example where error correction is performed by means of a BCH code at the time of data read from the SSD 10.

The host device 20 issues to the SSD 10 an extensive command of error correction (not shown). An acceptable latency time (acceptable latency) of error correction is added to the command as an attribute. The processing time may be designated qualitatively such as "as soon as possible" or quantitatively.

Then, the SSD 10 switches a switch SW1 by the received attribute signal and transmits read data to the host device 20.

Figure 3:
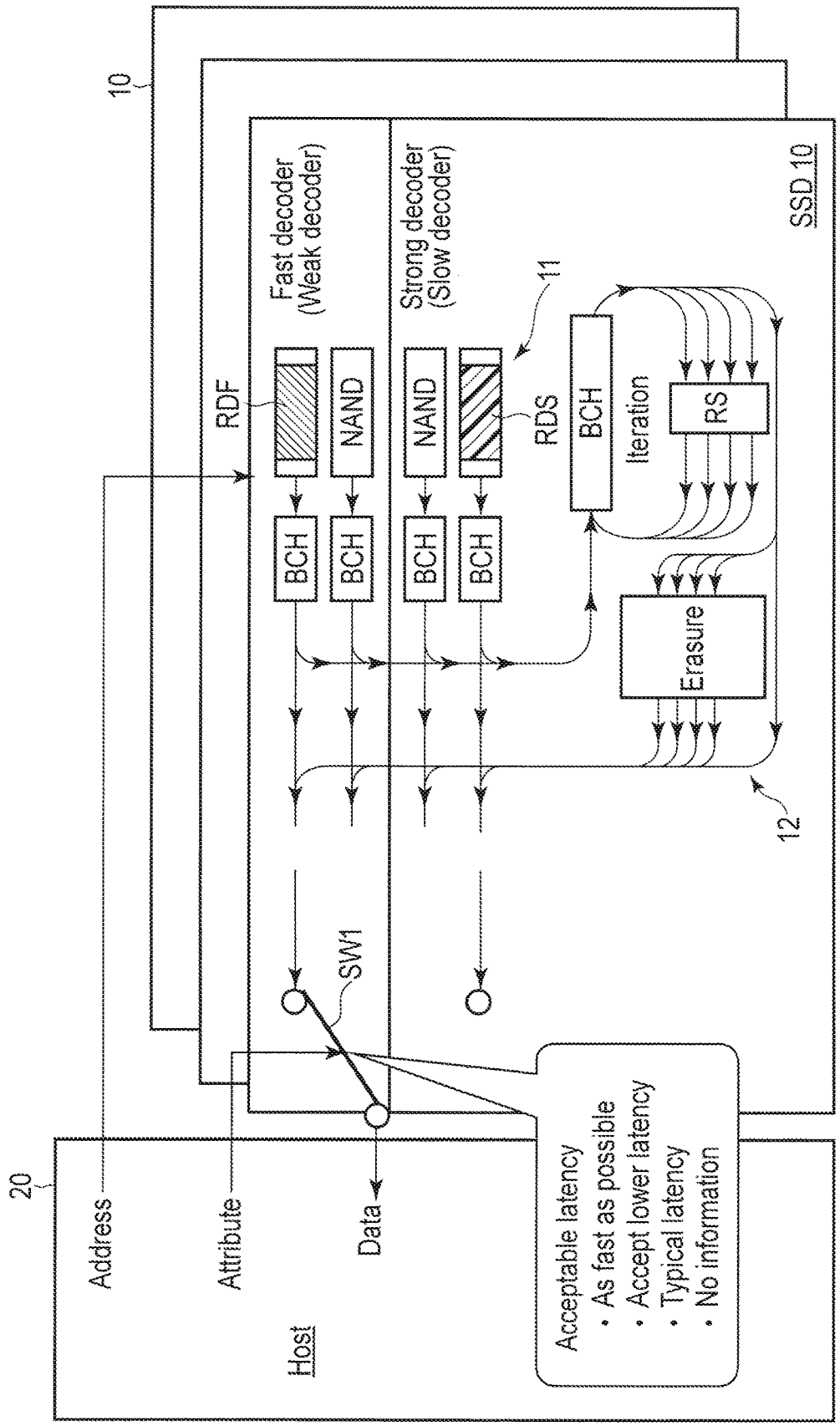
FIG. 3 is a block diagram illustrating an information processing system according to a first embodiment.

More specifically, when the acceptable latency time is short, the SSD 10 switches the switch SW1 to the upper column side (fast decoder [weak decoder]) of the NAND memory 11 in FIG. 3. Read data RDF is then transmitted to the host device 20 from the fast decoder, where the amount of error correction is relatively small.

On the other hand, when the acceptable latency time is long, the SSD 10 switches the switch SW1 to the lower column side (strong decoder [slow decoder]) of the NAND memory 11. Error correction is performed by means of a BCH code more intensively for read data RDS on the lower side (strong decoder [slow decoder]) of the NAND memory 11, where the amount of error correction is relatively large and intensive error correction is required. The read data RDS is then transmitted to the host device 20 in a similar manner.

If an error cannot be corrected, the SSD 10 returns the error to the host device 20.

As described above, according to the structure and operation of the first embodiment, it is possible to perform data read based on a latency time accepted by the host device 20. It is therefore possible to reduce the read time of error correction when performing a read operation. In other words, it is possible to make a setting in a read operation so that an error is returned without spending more time on correction than necessary when an error occurs.

Note that it is desirable that when an error occurs in one of the SSDs 10, read be performed from another SSD 10, etc., since the host device 20 makes a predetermined setting such as making redundant to the plurality of SSDs 10.

[2] Second Embodiment (Example of Garbage Collection)

Next, the second embodiment will be described with reference to FIG. 4. The second embodiment relates to an example of garbage collection (GC).

To begin with, the host device 20 issues to the SSD 10 an extensive command of garbage collection (not shown). Next, the SSD 10 returns to the host device 20 a state of garbage collection as an extensive status signal (not shown), based on an extensive command of garbage collection.

Then, the host device 20 performs control to make the SSD 10 perform garbage collection and secures the number of empty blocks at idle time, etc., of the host device 20, based on the received extensive status signal.

Note that when a data write operation is performed from the host device 20 during garbage collection, the SSD 10 autonomously stops garbage collection in order to perform data write and autonomously resumes garbage collection after completing data write.

However, when the number of empty blocks decreases markedly to be below the minimum amount necessary for data write, garbage collection is performed in advance.

Figure 4:
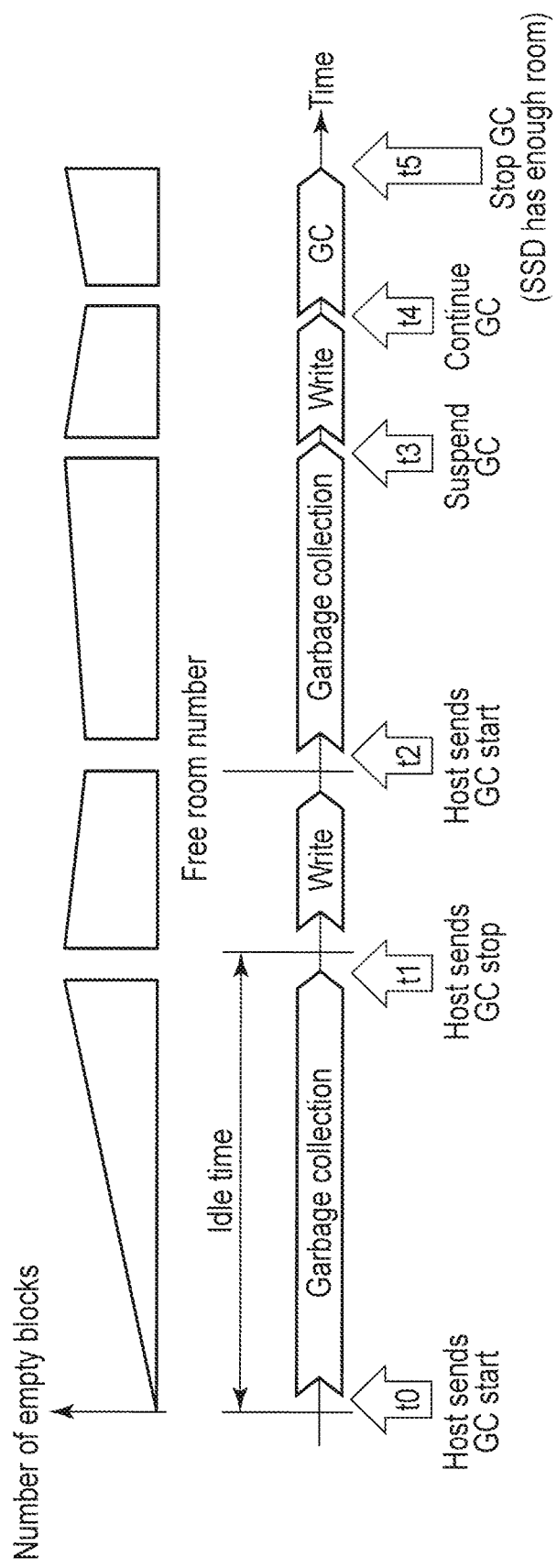
FIG. 4 is a diagram illustrating a relationship between time and the number of empty blocks as to garbage collection of an information processing system according to a second embodiment.

For example, as shown in FIG. 4, at time t0, the host device 20 issues a command to cause the SSD 10 to perform garbage collection and increases the number of empty blocks at idle time, based on the received extensive status signal.

Next, at time t1, when the idle state ends, the host device 20 stops garbage collection to perform a data write operation to the SSD 10.

Then, at time t2, the host device 20 resumes garbage collection after completing a data write operation. Note that between times t1 and t2, the number of secured empty blocks decreases in response to the data write operation.

Subsequently, at time t3, when the host device 20 resumes the data write operation to the SSD 10, the SSD stops garbage collection that has been performed.

Thereafter, at time t4, when a data write operation ends, the SSD 10 resumes garbage collection that has been stopped.

After that, at time t5, when the sufficient number of empty blocks is secured, the SSD 10 ends garbage collection.

As described above, according to the structure and operation of the second embodiment, it is possible to perform garbage collection to increase the number of empty blocks in advance, and secure it at free time such as idle time. Therefore, when the SSD 10 is busy such as in a busy state, garbage collection (GC) is less likely to occur and an average response time can be reduced.

[3] Third Embodiment (Example of Controlling Data Write Operation)

Next, the third embodiment will be described with reference to FIG. 5. The third embodiment relates to an example of controlling a data write operation, i.e., an example of controlling the kinds of a NAND memory, which is a write destination, according to an attribute of write data.

As shown, the NAND memory 11 of the third embodiment includes plural kinds of single-level cell (SLC) 111, multi-level cell (MLC) 112, triple-level cell (TLC) 113 and quad-level cell (QLC) 114.

Also, the SSD controller 12 of the third embodiment includes a control unit 121 which writes data separately for the above-mentioned kinds (111 to 114) of the NAND memory 11.

In the above-mentioned structure, the host device firstly issues to the SSD 10 an extensive write command to which an attribute such as data update frequency is added. Secondly, the SSD 10 returns an extensive status signal (not shown) to the host device in response to the extensive write command.

Then, the write control unit 121 of the SSD 10 writes write data in the above-mentioned kinds (111 to 114) of the NAND memory 11, based on the above-mentioned received extensive write command.

For example, when write data is meta data, etc., (for example, time stamp data) which is outside a file, the write control unit 121 writes the data to the SLC 111 based on the received extensive write command. This is because the meta data, etc., is rewritten frequently.

Also, when write data is user data, etc., which is inside a file, the write control unit 121 writes the write data to the MLC 112, the TLC 113 and the QLC 114, based on the received extensive write command. This is because the user data, etc., is rewritten infrequently.

As described above, in the third embodiment, the host device 20 issues an extensive write command with an attribute such as data update frequency. It is thereby possible to change the kinds of the NAND memory 11 to be used as necessary according to data attribute and to improve data write efficiency.

[4] Fourth Embodiment (Example of Power Distribution)

Next, the fourth embodiment will be described. The fourth embodiment relates to an example of distributing power to the SSD 10.

To begin with, the host device 20 issues to the SSD 10 an extensive command about consumption power. Next, the SSD 10 returns to the host device 20 information (achievement and prediction), which indicates the correspondence relationship between consumption power and performance, as an extensive status signal based on the extensive command about the consumption power.

Then, based on the received extensive status signal, the host device 20 determines distribution (budget) of consumption power to each SSD 10 in view of the performance of each SSD 10 within the acceptable range of the total consumption power of the plurality of the SSDs 10, and notifies each SSD 10 of the determined result.

As described above, according to the fourth embodiment, it is possible to distribute power that remains in one of the SSDs 10 to another SSD 10 based on an attribute of the SSD 10. It is therefore possible to use redundant power within the acceptable range of the total consumption power and to improve the whole performance of the plurality of SSDs 10.

[5] Fifth Embodiment (Example of Dividing SSDs into Groups)

Next, the fifth embodiment will be described. The fifth embodiment relates to an example of dividing the SSDs 10 into necessary groups (namespaces [partitions]) to perform control.

To begin with, the host device 20 issues to the SSD 10 an extensive command of predetermined grouping (not shown). Next, the SSD 10 returns to the host device 20 an extensive status signal (not shown) that indicates its own state (SSD 10), in response to the extensive command of the predetermined grouping.

The host device 20 divides into predetermined groups (namespaces) to perform control necessary for each of the groups, based on the received extensive status signal.

For example, the host device 20 performs the following controls:
1) To perform the garbage collection (GC) control described in the second embodiment for each of the predetermined groups. In other words, the host device performs control for the SSD 10 so that garbage collection (GC) in one of the groups does not affect the performance of another group;
2) To set, for each group, a management unit of a lookup table (LUT) of a flash translation layer (FTL);
3) To set, for each group, the presence or absence and the amount of thin-provisioning (showing larger capacity than the capacity of the NAND memory 11 to a user);
4) To set, for each group, the presence or absence and the amount of over-provisioning (showing smaller capacity than the capacity of the NAND memory 11 to a user);
5) To set, for each group, control as to the kinds of the NAND memory 11 described in the above-mentioned third embodiment; and
6) To divide groups into hot data (frequently-updated data) and cold data (infrequently-updated data) and to allocate the blocks of the NAND memory 11 for each group. By thus grouping in advance, it is possible to perform wear leveling for each group and to reduce the frequency of the garbage collection.

As described above, according to the fifth embodiment, it is possible to divide the SSDs 10 into groups as necessary and to improve performance.

[6] Sixth Embodiment (Example of Allocating NAND Blocks by Each Attribute)

Next, the sixth embodiment will be described. The sixth embodiment relates to an example of allocating the physical blocks of the NAND memory 11 by each attribute.

As to the control of an extensive command and status signal, a detailed description is omitted as being substantially the same as above.

In the sixth embodiment, the host device 20, etc., adds an attribute corresponding to a file data, etc., and allocates physical blocks of the NAND memory 11 by each attribute. Under the above-mentioned control, since the whole of the physical block of the NAND memory 11 becomes empty when the data having the same attribute is deleted simultaneously, it is possible to reduce garbage collection (GC).

[7] Seventh Embodiment (Example of Providing Advanced Information)

Next, the seventh embodiment will be described. The seventh embodiment relates to an example of providing advantageous information, etc.

As to the control of an extensive command and status signal, a detailed description is omitted as being substantially the same as above.

In the seventh embodiment, advanced information for the host device 20 such as write-amplification factor (WAF), information of used block and information of empty block is transmitted from the SSD 10 to the host device 20 on a regular basis. The host device 20 performs necessary control based on the transmitted advanced information.

[8] Eighth Embodiment (Example of Providing NAND Block Boundary Information)

Next, the eighth embodiment will be described with reference to FIG. 6. The eighth embodiment relates to an example of providing NAND block boundary information.

As to the control of an extensive command and status signal, a detailed description is omitted as being substantially the same as above.

In the eighth embodiment, the SSD 10 shows the host device 20 information indicating "how many more times of writing would fill the NAND blocks." Based on the information shown in the SSD 10, the host device 20 can perform data write per physical block of the NAND memory 11 until it reaches an appropriate state. It is therefore possible to reduce garbage collection.

Figure 6:
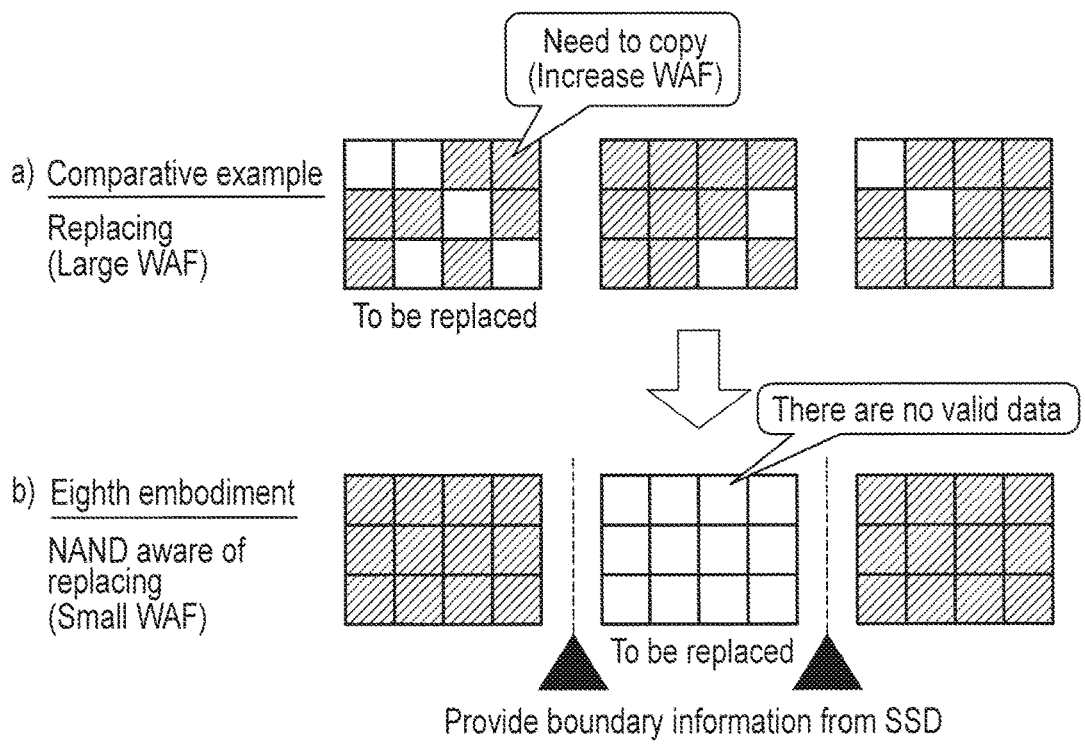
FIG. 6 is a diagram schematically illustrating blocks according to an eighth embodiment and blocks of a comparative example.

For example, as shown in FIG. 6 (*a*), the host device 20 cannot recognize the write state of the NAND blocks in the comparative example. Therefore, data having different file names, etc., is written together with the physical blocks of the NAND memory. This increases WAF caused by garbage collection, etc.

On the other hand, as shown in FIG. 6 (*b*), the host device 20 recognizes the write state of the NAND blocks in the eighth embodiment. Therefore, it is possible to write to the physical blocks of the NAND memory 11 separately for predetermined information such as file name. This reduces WAF caused by garbage collection, etc.

[9] Ninth Embodiment (Example of Dynamic Resizing)

Next, the ninth embodiment will be described. The ninth embodiment relates to an example of dynamic resizing of the SSD 10. The portions that substantially overlap with the above-mentioned embodiments will not be described.

[9-1] Structure and Operation

Figure 7:
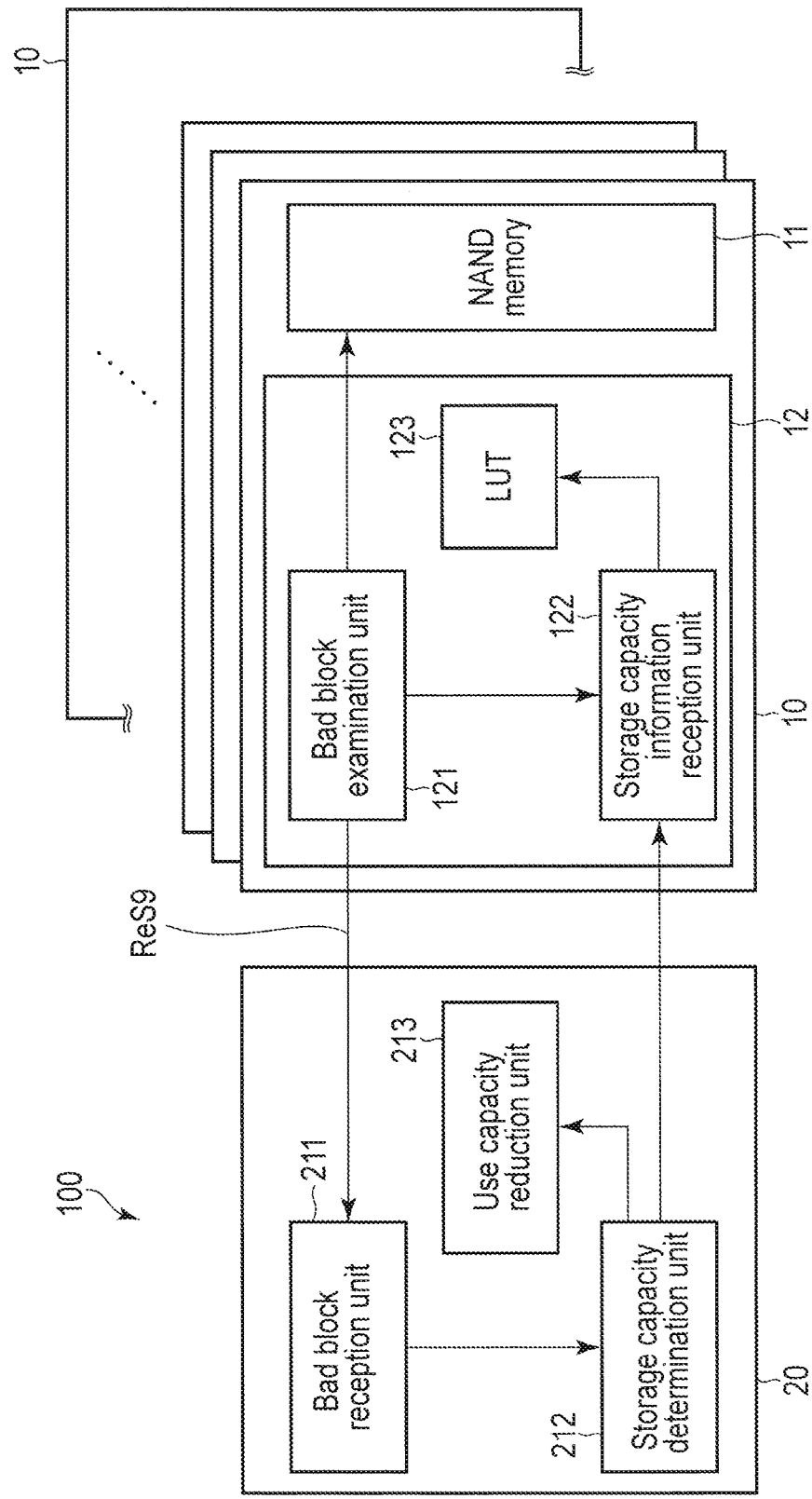
FIG. 7 is a block diagram illustrating an information processing system according to a ninth embodiment.

To begin with, the structure and operation of the ninth embodiment will be described with reference to FIG. 7.

In the information processing system 100, the host device 20 designates a place (address) of data in a logical block address (LBA) when performing read and write of the data to the SSD 10. On the other hand, the SSD 10 manages mapping from an LBA to a physical block address (PBA) in a lookup table (LUT) 123. The LBA being used is mapped to the used block of the LUT.

[9-1-1] SSD 10

As shown, the SSD controller 12 of the SSD 10 of the ninth embodiment includes a bad block examination unit 121, a storage capacity information reception unit 122 and the lookup table (LUT) 123.

The bad block examination unit 121 receives an extensive command of a bad block from the host device 20, responses thereto, and returns it to the host device 20 as an extensive status signal ReS9 of a bad block. Further, the bad block examination unit 121 notifies the signal to the storage capacity information reception unit 122.

The bad block examination unit 121 can adopt two means of notifying the increase in number of bad blocks from the SSD 10 to the host device 20.

The first means is to add the number of bad blocks to the statistic information of the SSD 10. If this information is read by, for example, polling from the host device 20 on a regular basis, it is possible to make an indirect notification.

The second means is to make a direct notification from the SSD 10 to the host device 20 by means of a callback mechanism. In detail, when the number of bad blocks increases to the fixed predetermined number or the number defined by the host device 20, the protocol of the interface of the SSD 10 is extended so as to issue a notification.

The storage capacity information reception unit 122 receives the above-mentioned signal from the bad block examination unit 121 and control from the host device 20, and updates information of the LUT 123.

The correspondence relationship of an LBA and a PBA is mapped on the LUT (logical physical address conversion table) 123.

[9-1-2] Host Device 20

The host device 20 of the ninth embodiment includes a bad block information reception unit 211, a storage capacity determination unit 212 and a use capacity reduction unit 213.

The bad block information reception unit 211 receives the above-mentioned extensive status signal ReS9 from the SSD 10 and transmits bad block information to the storage capacity determination unit 212.

The storage capacity determination unit 212 receives the bad block information from the bad block information reception unit 211, determines storage capacity, and notifies the use capacity reduction unit 213 and the storage capacity information reception unit 122 of the SSD 10. In other words, the storage capacity determination unit 212 notifies the SSD 10 of the decrease in use capacity in accordance with the determination of use capacity.

The storage capacity determination unit 212 can adopt any of three means of notifying the decrease in use capacity from the host device 20 to the SSD 10.

The first means is to create in the SSD 10 a new command of setting the maximum value (user capacity) of an LBA and to issue this command from the host device 20. On receipt of the command, the mapping of the LBA exceeding the maximum value can be released in the LUT 123 on the side of the SSD 10.

The second means is to use a TRIM or UNMAP command. By means of these commands, it is possible to notify an LBA that is not used by the host device 20. On receipt of the command, the mapping of the LBA of the LUT 123 can be released on the side of the SSD 10.

The third means is to extend a bad sector designation command (WRITE_UNCORRECTABLE_EXT). This command, when reading and writing the designated LBA thereafter, causes the SSD 10 to return an error. In addition, extension is made so as to release the mapping of the LBA.

The use capacity reduction unit 213 reduces capacity to be used in accordance with the storage capacity received from the storage capacity determination unit 212.

The use capacity reduction unit 213 can adopt either of two means of reducing use capacity of the host device 20 on receipt of the above-mentioned notification from the storage capacity determination unit 212.

The first means is to reduce use capacity by deleting data that can be deleted such as cache data (stored data in which the same data overlaps in another SSD [storage device] 10 and an HDD).

The second means is to transfer data from one of the SSD 10 to another SSD 10 having allowance to reduce use capacity of the former SSD 10, when a combination of the plurality of SSDs 10 is used as in a logical volume manager (LVM).

[9-2] Advantageous Effect

As described above, according to the ninth embodiment, it is possible to obtain at least an advantageous effect of prolonging the life of the SSD by reducing capacity used for the host 20, when the number of bad blocks of the NAND memory 11 increases, in addition to the above-mentioned outline and the effects of the embodiments.

In the following, the comparative example and the ninth embodiment will be described.

[9-2-1] Comparative Example

As described above, an SSD is a storage device electrically connected to a host device (for example, calculator) to perform read and write of data from the host device.

In an SSD, a NAND memory is used as a nonvolatile memory and is managed per block. The block of a NAND memory is classified into three types of blocks including a bad block that cannot be used due to, for example, manufacturing defect or life, a used block that stores data written from a host, and an empty block that is not used. When the number of bad blocks and used blocks increases, the number of empty blocks decreases accordingly.

The storage capacity (use capacity) of a storage device used by a host device is limited by user capacity. The user capacity is the remaining capacity in which the capacity of allowance (over-provisioning) is subtracted from the capacity (physical capacity) corresponding to all the blocks of an SSD.

In an SSD, when the number of empty blocks decreases, the above-mentioned WAF (write-amplification factor) increase and the life and response speed decrease markedly.

When the number of empty blocks decreases because the capacity used by a host device increases and the number of used blocks increases, the host device recognizes its use capacity. It is therefore possible to manage the balance between the decrease of life, response speed, etc., and use capacity.

However, when the number of bad blocks increases and the number of empty blocks decreases, a host device cannot recognize it. Therefore, when the number of bad blocks increases, there is a tendency that the number of empty blocks decreases while a host device does not recognize it and the life and response speed of an SSD decreases accordingly.

It is possible to curb this tendency by increasing the above-mentioned over-provisioning and reducing user capacity. However, if user capacity is small from the beginning, user's convenience and marketability are reduced.

[9-2-2] Ninth Embodiment

In comparison with the above-mentioned comparative example, according to the ninth embodiment, at least the bad block detection unit 121, which receives an extensive command of a bad block and notifies the increase in number of bad blocks from the SSD 10 to the host 20 as the information ReS9, is included. The host device 20, which has received the notification, reduces use capacity by means of the use capacity reduction unit 213 so as not to cause any problem even when use capacity decreases. Further, the reduced use capacity is notified from the host 20 to the SSD 10 by means of the storage capacity determination unit 212. The SSD then reduces the number of used blocks by means of the storage capacity information reception unit 122.

According to such a structure and operation, the host device 20 reduces use capacity as necessary and the SSD 10 can secure the empty blocks accordingly. It is thereby possible to prolong and the life of the SSD and to prevent the reduction of the speed of response to the SSD 10.

As describe above, it is obvious in the comparative example that at least the bad block detection unit 121 which notifies the increase in number of bad blocks from an SSD to a host, and the use capacity reduction unit 213 in which a host reduces use capacity on receipt of a notification are not included. Note that a TRIM and/or UNMAP command may be a means for notifying the decrease of use capacity from a host to an SSD. However, they are used when an application program on the host device 20 individually deletes data. That is, they are irrelevant to the increase in number of bad blocks in the NAND memory 11 of the SSD 10.

[10] Tenth Embodiment 10-1. Structure 10-1-1. General Structure

Figure 8:
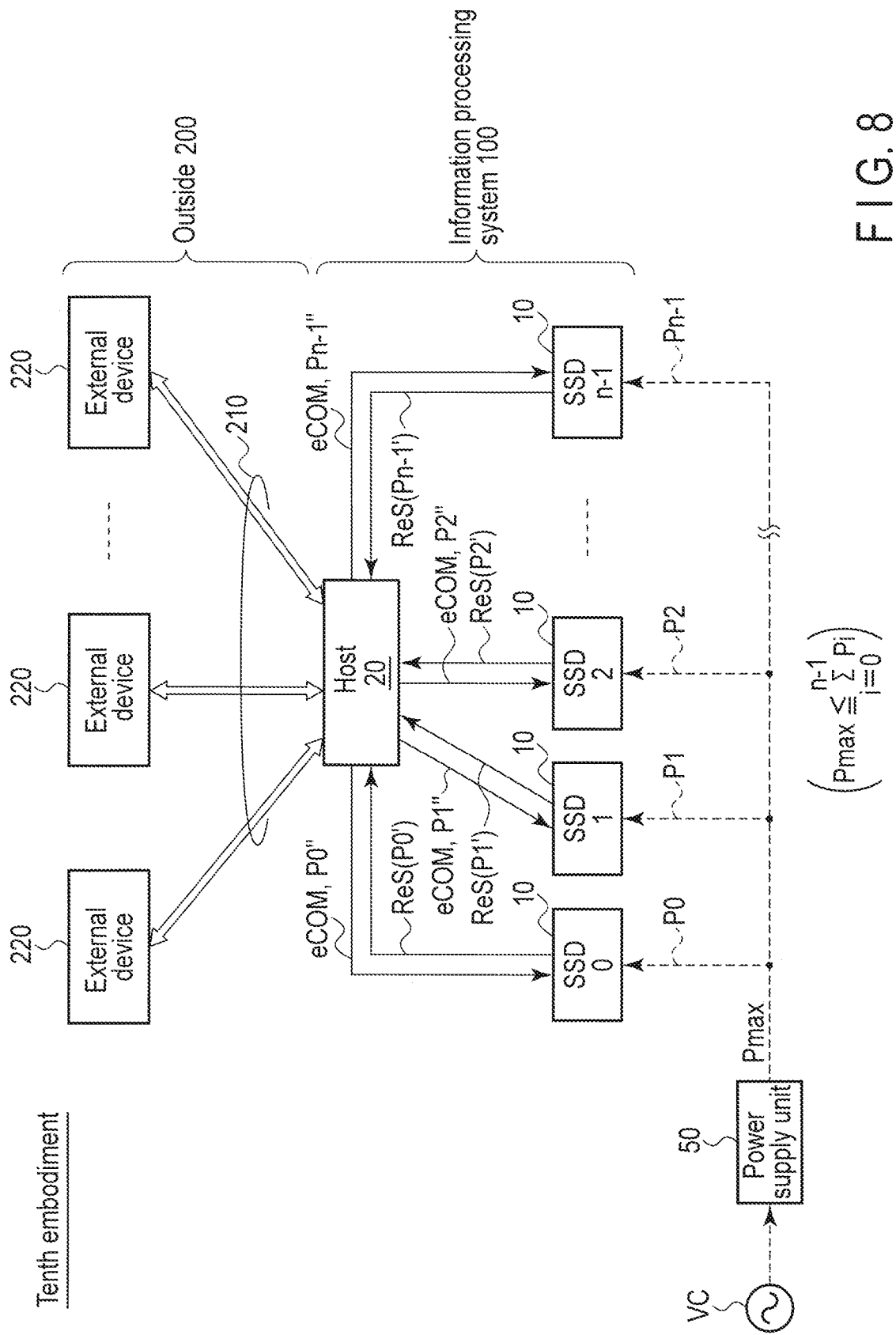
FIG. 8 is a block diagram showing a general structure of information processing system according to the tenth embodiment.

A general structure including an information processing system 100 of the tenth embodiment is described with reference to FIG. 8. FIG. 8 represents power paths by broken lines and signal paths by solid lines.

As shown in FIG. 8, the information processing system 100 of the tenth embodiment is driven by power Pmax supplied from a power supply unit 50, and executes a process and request (for example, a request to write data, etc.) of external devices 220 which access the information processing system 100 from the outside 200 via a network 210.

The information processing system 100 comprises SSD0 to SSDn−1 (n is a positive integer), which are storage devices 10, and a host 20 which controls the storage devices 10. Solid-state drives (SSDs) are described as an example of the storage devices 10. The storage devices 10 are not limited to SSDs and may be, for example, hard disc drives (HDDs) or other storage devices and memories. The detailed structure of the storage devices 10 and the host 20 will be described later.

The power supply unit 50 converts external power supplied from an external power source VC to the predetermined power Pmax. The converted power Pmax is almost equally divided into power components P0 to Pn−1 to be supplied to the storage devices 10, respectively. In the tenth embodiment, the total power Pmax supplied to the information processing system 100 is predetermined and the value is substantially constant. Therefore, the value of power Pmax supplied from the power supply unit 50 is not greater than the sum total of power components P0 to Pn−1 supplied to SSD0 to SSDn−1, respectively, that is $$P\max \leq \Sigma Pi, \qquad (I)$$

where i=0, 1, 2, . . . , n−1.

The external devices 220 access the information processing system 100 from the outside 200 of the information processing system 100 via the network 210, and performs a predetermined process or makes a predetermined request (for example, data reading, data writing, data erasing, etc.) to the accessed information processing system 100. The network 210 is not limited to wired or wireless.

In the above structure, the information processing system 100 of the tenth embodiment changes power components to be distributed to the storage devices 10 and optimizes the power components (P0 to Pn−1→P0″ to Pn−1″) in accordance with a load on the storage devices (SSD0 to SSDn−1). According to such a structure, the information processing system 100 of the tenth embodiment can improve efficiency of the system. The effect and advantage will be described later in detail.

10-1-2. Information Processing System

Figure 9:
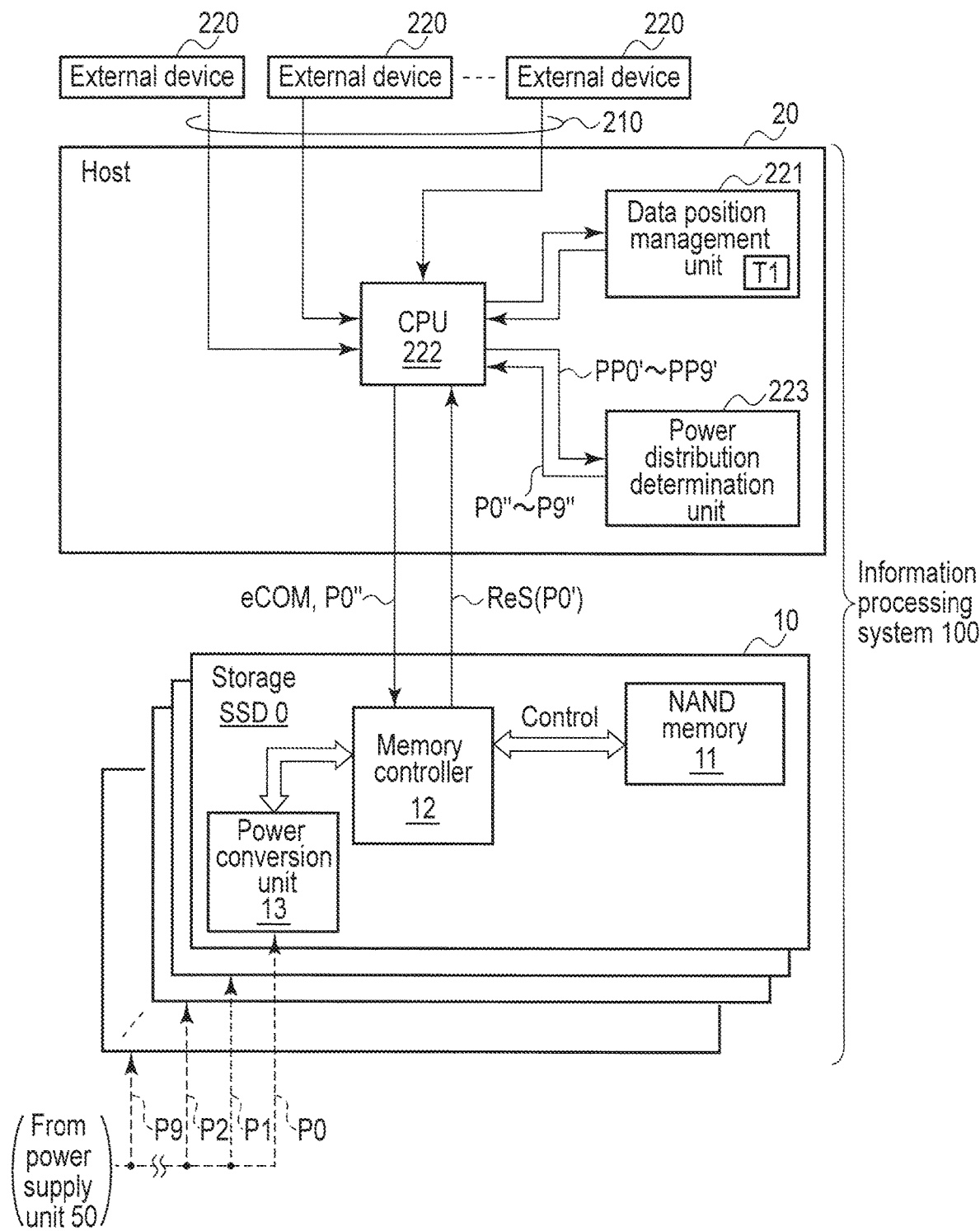
FIG. 9 is a block diagram showing a detailed structure of the information processing system according to the tenth embodiment.

The detailed structure of the information processing system 100 of the tenth embodiment is described with reference to FIG. 9. As described above, the information processing system 100 comprises SSD0 to SSDn−1, which are the storage devices 10, and the host 20 which controls the storage devices 10. In the description below, the information processing system 100 comprises ten SSDs, i.e., SSD0 to SSD9 (n=10), as an example.

[Storage]

Each of SSD0 to SSD9, which are the storage (storage units) 10, comprises a NAND flash memory (hereinafter referred to as a "NAND memory") 11, a memory controller 12 and a power conversion unit 13.

The NAND memory 11 is a nonvolatile semiconductor memory which comprises blocks (physical blocks) and stores data in each block. Each block comprises memory cells positioned at intersections of word lines and bit lines. Each memory cell comprises a control gate and a floating gate and stores data in a nonvolatile manner by the presence or absence of electrons injected into the floating gate. The word lines are commonly connected to the control gates of the memory cells. A page exists in each word line. Data reading and writing operations are performed per page. Therefore, a page is a unit of data reading and writing. Data is erased per block. Therefore, a block is a unit of data erasing. The NAND memory 11 of the tenth embodiment may be multi-level cell (MLC) capable of storing multibit data in a memory cell and/or single-level cell (SLC) capable of storing one-bit data in a memory cell MC.

The memory controller 12 controls the operation of the whole of the storage device 10 in accordance with a request from the host 20. For example, the memory controller 12 writes write data to a predetermined address of the NAND memory 11 in accordance with a write command which is a request to write data from the host 20. The memory controller 12 of the tenth embodiment further receives an extended command eCOM transmitted from the host 20 to confirm minimum power required for the operation of each of SSD0 to SSD9. The extended command eCOM is a signal transmitted on purpose to detect various states of the storage device (for example, a state of power consumption of the storage device 10 in this case), and is defined as a signal different from the above-described write command, etc. The extended command eCOM is not limited to a command eCOM and may be any extended predetermined signal (information, request, instruction, etc.).

The memory controller 12 of each of SSD0 to SSD9 transmits a status signal ReS (P0' to P9') indicative of the minimum power required for the operation in reply to the received request eCOM. The signal transmitted in reply is not limited to the status signal ReS and may be any extended predetermined signal (information, request, instruction, etc.).

The memory controller 12 of each of SSD0 to SSD9 controls the power conversion unit 13 to operate based on the changed power component (P0″ to P9″) notified by the host 20. The operation will be described later in detail.

The power conversion unit 13 converts the power component (P0 to P9) supplied from the power supply unit 50 under the control of the memory controller 12. The storage device 10 performs a predetermined operation in accordance with the power supplied from the power conversion unit 13.

Of course, the storage devices 10 are not limited to the above-described structure. For example, each memory controller 12 may comprise an address mapping (address translation) table indicative of a correspondence relationship between logical addresses managed by the host 20 and physical addresses managed by the storage device 10. There is no order as to which of the extended command eCOM and the extended status signal ReS should be transmitted first. That is, the extended predetermined signal may be first transmitted from the storage device 10 to the host 20 and then the extended predetermined signal may be transmitted from the host 20 to the storage device 10.

[Host]

The host 20 controls each storage device 10 in accordance with a request from the external devices 220 which access from the outside via the network 210. The host 20 comprises a data position management unit 221, a power distribution determination unit 223 and a central processing unit (CPU) 222.

The data position management unit 221 manages, for example, position information of write data stored in the storage devices 10 under the control of the CPU 222. The data position management unit 221 comprises a table (first table) T1. Table T1 indicates at least a power/performance characteristic of each of SSD0 to SSD9 as described later.

The power distribution determination unit 223 determines power to be distributed to each of SSD0 to SSD9 under the control of the CPU 222. More specifically, the power distribution determination unit 223 determines power components P0" to P9" to be redistributed to SSD0 to SSD9, respectively, based on the corrected characteristics PP0' to PP9' of the storage devices 10 transmitted from the CPU 222. The CPU 222 is notified of the determined power components P0" to P9".

The CPU 222 controls the data position management unit 221 and the power distribution determination unit 223 and controls the operation of the whole of the host 20.

Of course, the host 20 is not limited to the above-described structure. For example, the host 20 may comprise an interface to communicate with the storage devices 10, etc.

10-1-3. Table T1

Table T1 of the tenth embodiment is described in detail with reference to FIG. 10 and FIG. 11. FIG. 10 is a table showing table T1 of the tenth embodiment.

As shown in FIG. 10, SSD0 to SSD9, which are the storage devices 10, are associated with theoretical power/performance characteristics (electrical characteristics) PP0 to PP9, respectively, in table T1. Each of power/performance characteristics PP0 to PP9 is shown as a typical characteristic based on the assumption that the performance varies depending on the amount of supplied power.

Figure 11:
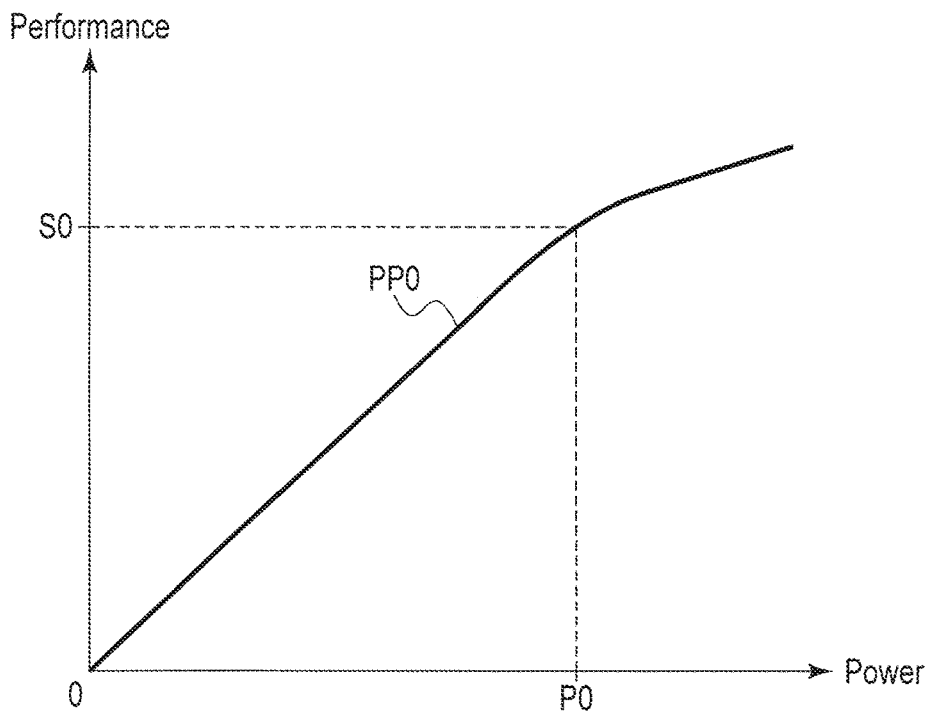
FIG. 11 is a graph showing an example of theoretical power/performance characteristics of the information processing system according to the tenth embodiment.

For example, FIG. 11 shows a power/performance characteristic PP0 of SSD0. As shown in FIG. 11, in characteristic PP0, the performance increases from the origin 0 proportionately with the supplied power in theory. More specifically, when the supplied power is power component P0, SSD0 can deliver performance S0 proportionately with power component P0. However, a proportionality coefficient of the performance decreases when the supplied power increases to some degree. For example, when the supplied power exceeds power component P0, the proportionality coefficient of the performance decreases. This is because, for example, the amount of heat produced in the controller 12 increases when the supplied power increases to some degree.

"The performance (performance index)" may include all operations and functions performed by the NAND memory 11 depending on the supplied power. For example, the performance of the NAND memory 11 may include data writing, data reading, data erasing, garbage collection (compaction), inputs/outputs per second (IPOS), megabytes per second (MB/s), etc. IPOS is the number of times data can be written to the NAND memory 11 per second. MB/s is a communication speed between the host 20 and the NAND memory 11. Power/performance characteristics PP1 to PP9 of the other SSD1 to SSD9 are the same as PP0.

10-2. Operation

Next, the operation of the information processing system 100 of the tenth embodiment having the above structure is described.

10-2-1. Distribution Power Determination Process

Figure 12:
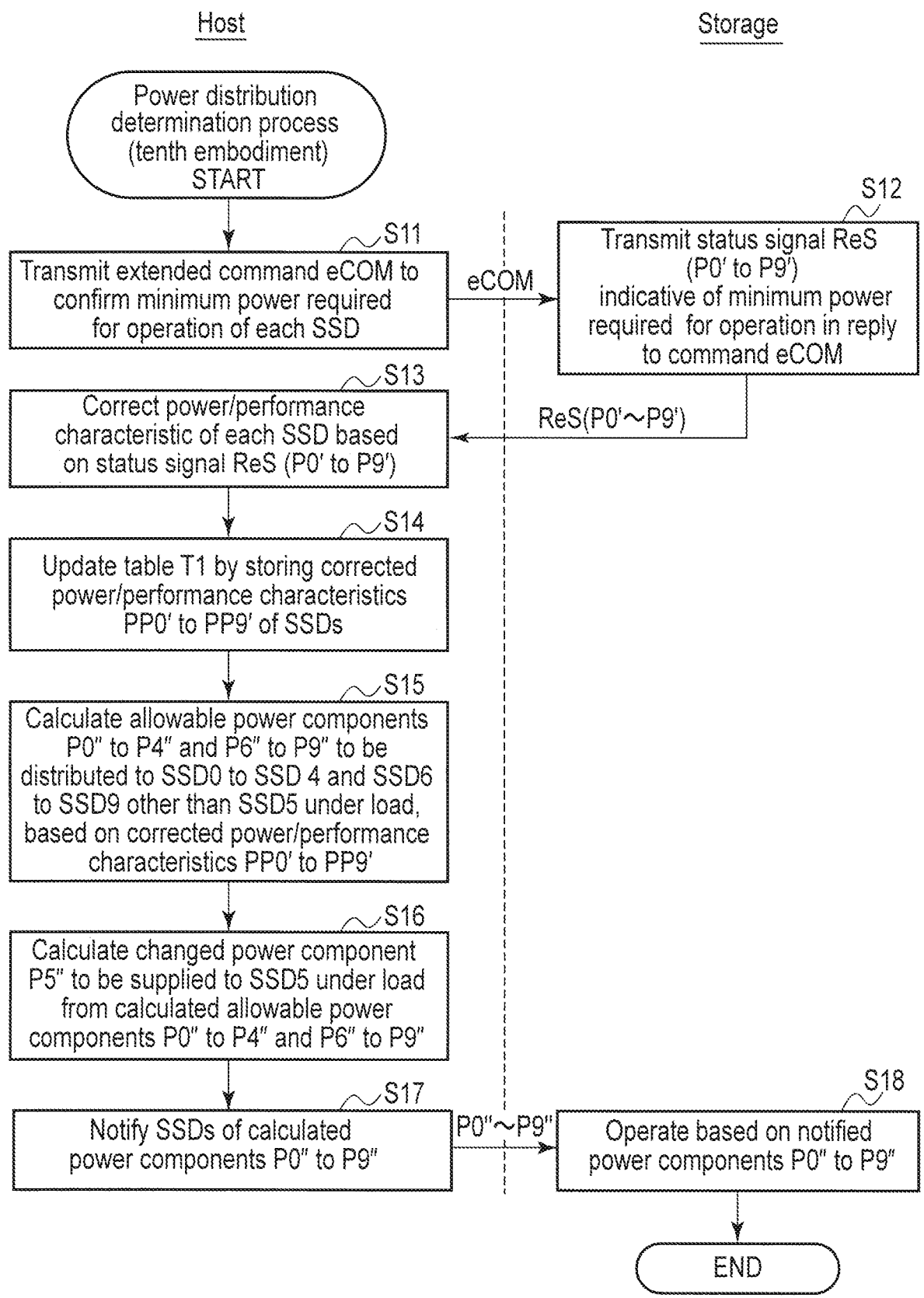
FIG. 12 is a flowchart showing a power distribution determination process according to the tenth embodiment.

A distribution power determination process of the information processing system 100 of the tenth embodiment is described with reference to FIG. 12. As an example, the description below is based on the assumption that a specified SSD5 is intensively accessed by the external devices 220 and the CPU 222 of the host 20 determines that the larger load (larger power) is necessary for SSD5.

First, in step S11, the CPU 222 of the host 20 transmits an extended command (first command) eCOM to confirm the minimum power required for the operation of each of SSD0 to SSD9.

In step S12, the memory controller 12 of each storage device 10 transmits a status signal ReS (P0' to P9') indicative of the minimum power required for the operation in reply to the received request eCOM. For example, the memory controller 12 of SSD0 first detects the minimum power component P0' required for the operation of the NAND memory 11 of SSD0 based on the relationship between the performance and power component P0 supplied to the NAND memory 11, in accordance with the received request eCOM. Next, the memory controller 12 of SSD0 transmits the detected minimum power component P0' to the host 20 as a status signal ReS (P0').

Figure 13:
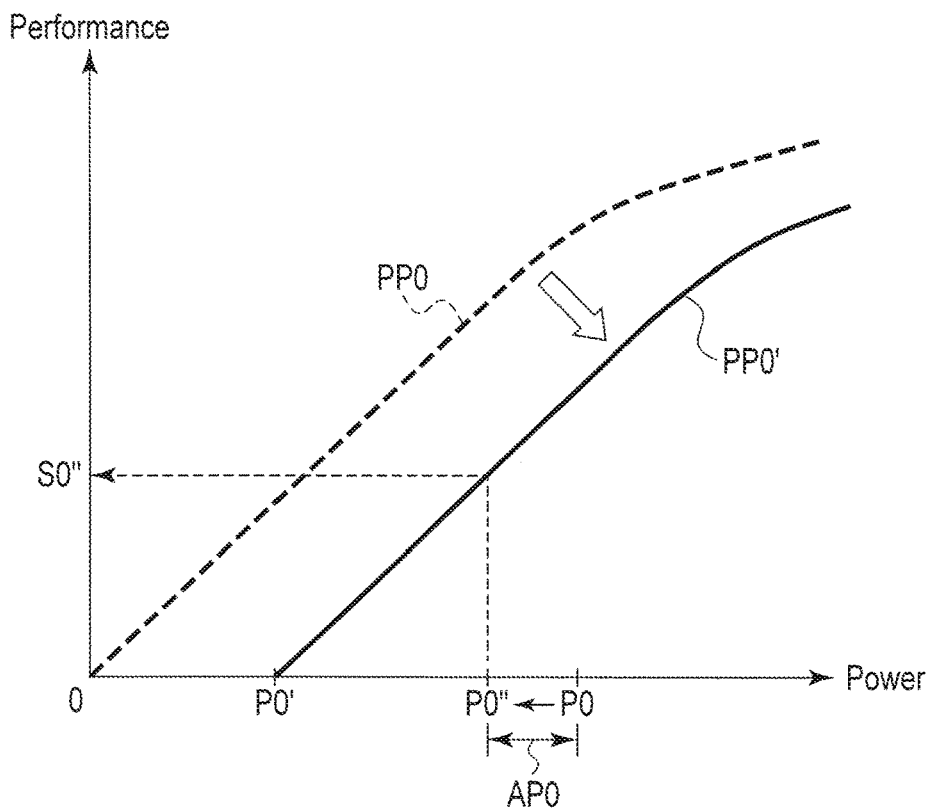
FIG. 13 is a graph showing an example of actual power/performance characteristics of the information processing system according to the tenth embodiment.

In step S13, the CPU 222 of the host 20 corrects the power/performance characteristic of each SSD based on the transmitted status signal ReS (P0' to P9'). More specifically, for example, the power distribution determination unit 223 of the host 20 increases the initial value of characteristic PP0 from the origin 0 to P0' based on the status signal ReS (P0') indicative of the minimum power required for the operation of SSD0, as shown in FIG. 13. The power distribution determination unit 223 further corrects characteristic PP0 by performing parallel translation of characteristic PP0 and thereby calculates an actual characteristic PP0'. As described above, the minimum power required for driving components other than the NAND memory 11, for example, the memory controller 12 and the other peripheral circuits can be considered by calculating characteristic PP0'. As a result, the characteristic can be calculated with more precision based on the actual status of each storage device 10. The other characteristics PP1' to PP9' are also calculated in the same manner as PP0'.

In step S14, as shown in FIG. 14, the CPU 222 of the host 20 stores the corrected power/performance characteristics PP0' to PP9' of SSD0 to SSD9 in table T1 and thereby updates table T1. In the following steps S15 and S16, too, the CPU 222 stores calculated allowable power components P0" to P4" and P6" to P9" and changed power components P5" in table T1.

In step S15, the power distribution determination unit 223 of the host 20 calculates allowable power components P0" to P4" and P6" to P9" to be distributed to SSDs other than SSD5 under a load, i.e., SSD0 to SSD4 and SSD6 to SSD9, based on the corrected power/performance characteristics PP0' to PP9'. More specifically, as shown in FIG. 13, the power distribution determination unit 223 calculates suppressible power component (surplus power component) P0" from the currently supplied power component P0 based on the corrected characteristic PP0'. "The allowable power (suppressible power, surplus power)" may be any power as long as the NAND memory 11 can continuously operate. The other allowable power components P1" to P9" are calculated in the same manner as allowable power component P0".

In step S16, the power distribution determination unit 223 of the host 20 calculates power component P5" changed to be supplied to SSD5 under a load, from the calculated allowable power components P0" to P4" and P6" to P9". More specifically, as shown in FIG. 13, the power distribution determination unit 223 first calculates differences AP0 to AP4 and AP6 to AP9 between the currently-distributed power components P0 to P4, P6 to P9 and the calculated suppressible power components P0" to P4", P6" to P9", respectively. Next, the power distribution determination unit 223 adds the calculated difference power components AP0 to AP4 and AP6 to AP9 to power component P5 assigned to SSD5. As a result, the power distribution determination unit 223 calculates power component P5" (=P5+[AP0 to AP4 and AP6 to AP9]) as the power component changed to be supplied to SSD5.

In step S17, SSD0 to SSD9 are notified of the changed power components P0" to P9" calculated by the host 20.

In step S18, SSD0 to SSD9 operate based on the notified changed power components P0" to P9". More specifically, the power conversion units 13 of SSD0 to SSD9 convert power components P0 to P9 supplied from the power supply unit 50 into power components P0" to P9" notified by the memory controllers 12.

As a result, the specified SSD5 operates based on power component P5" which is larger than the previous power component P5. The other SSD0 to SSD4 and SSD6 to SSD9 operate based on power components P0" to P4" and P6" to P9" which have been obtained by subtracting the suppressible power from the previous power components P0 to P4 and P6 to P9 and are lower than the previous power components P0 to P4 and P6 to P9.

10-3. Advantageous Effect

As described above, according to the structure and operation of the information processing system 100 of the tenth embodiment, at least the mentioned same effects and the following effect (1) can be achieved.
(1) The Efficiency of the System can be Improved.

Figure 5:
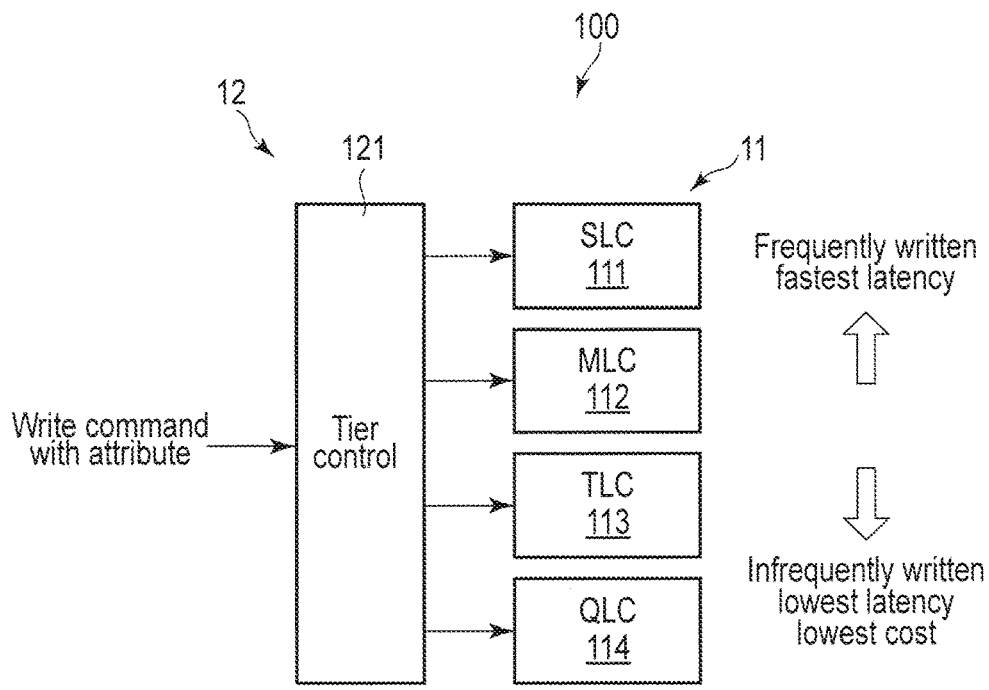
FIG. 5 is a block diagram illustrating an information processing system according to a third embodiment.

For example, if the host 20 determines that the larger load (larger power) is necessary for a specified SSD5, the host 20 transmits an extended command eCOM to ascertain the status and characteristic (in this case, the minimum power) of each of SSD0 to SSD9 (S11 in FIG. 5). Next, when receiving the command eCOM, each storage device 10 transmits a status signal ReS (P0' to P9') indicative of the minimum power required for the operation to the host 20 in reply (S12 in FIG. 5). The host 20 corrects power/performance characteristics of SSDs based on the status signals ReS (P0' to P9') and calculates the changed power components P0" to P9" from the corrected characteristics PP0' to PP9' (S13 to S16 in FIG. 5). After that, the storage devices 10 operate based on the calculated changed power components P0" to P9".

According to the above-described structure and operation, the efficiency of the whole information processing system 100 can be improved by intensively injecting allocatable power to SSD5 under a load to improve the processing performance of SSD5.

Figure 15:
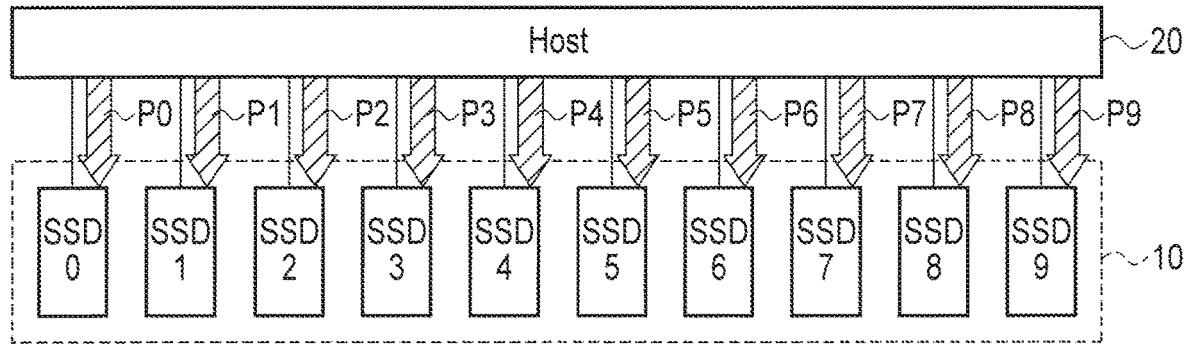
FIG. 15 is a view showing power distribution to be changed.

For example, before the power is changed, SSD0 to SSD9 operate based on power components P0 to P9 almost evenly distributed under the control of the host 20 as shown in FIG. 15. If the total amount of power Pmax supplied to the information processing system 100 is predetermined as expressed by expression (I), it is not necessarily preferable to evenly distribute power components P0 to P9 to SSD0 to SSD9 assuming that the maximum performance should be provided by the limited power Pmax. This is based on the premise that the performance of the storage devices 10 varies depending on the power consumption as shown in FIG. 11 and FIG. 13. For example, when a group of servers, which are the external devices 220, accesses the same SSD5 as described above and stores and refers to data of the application, etc., SSD5 is intensively accessed and is required to perform a large amount of processes.

Figure 16:
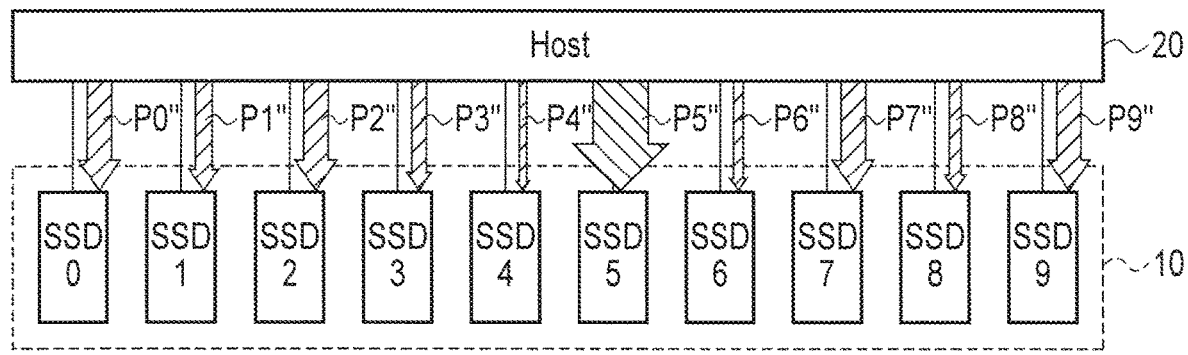
FIG. 16 is a view showing changed power distribution.

Therefore, as shown in FIG. 16, the power is changed to increase the power supplied to SSD5. SSD5, which requires the larger power, can thereby operate based on the larger power component P5". The other SSD0 to SSD4 and SSD6 to SSD9 can continuously operate based on power components P0" to P4" and P6" to P9" obtained by subtracting the suppressible power.

Figure 17:
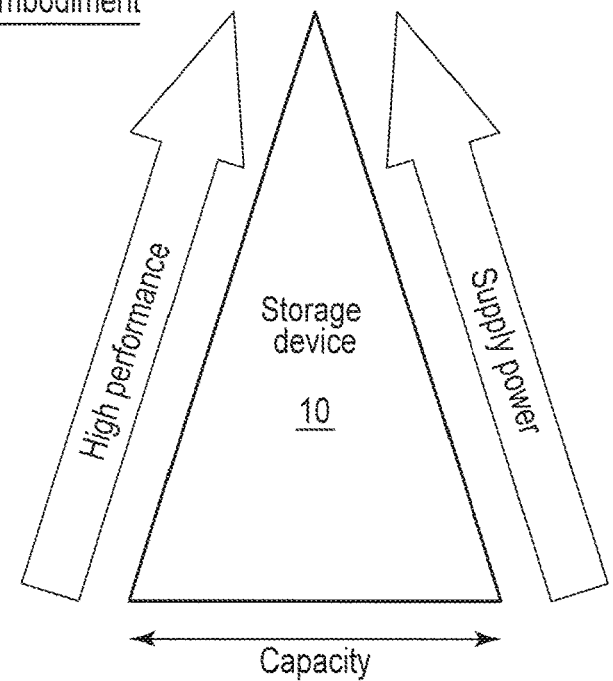
FIG. 17 is a view schematically showing a storage architecture according to the tenth embodiment.

As a result, according to the tenth embodiment, the processing capability of the storage devices 10 can be substantially hierarchical based on the supplied amount of power as shown in FIG. 17 even if the system is constituted by one type of storage devices 10. More specifically, with respect to data required to be frequently accessed (in this case, data stored in SSD5), the supplied power is increased and the processing ability and speed are improved. As described above, the information processing system 100 of the tenth embodiment has an advantage that an arbitrary storage device 10 can be used as a high-speed layer (higher layer) and the efficiency of the whole system can be improved.

Figure 18:
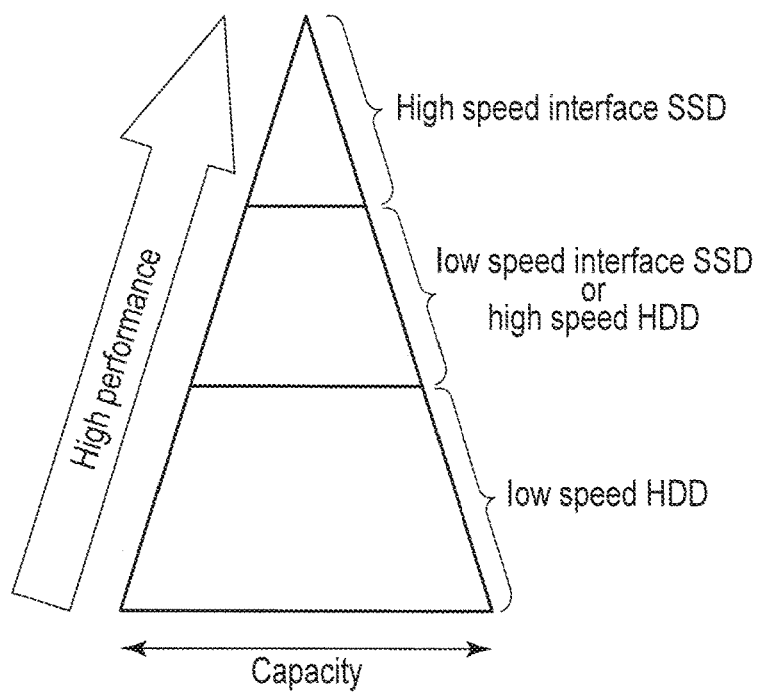
FIG. 18 is a view schematically showing a storage architecture according to a comparative example.

In contrast to the tenth embodiment, a comparative example has a hierarchical structure constituted by several types of storage devices as shown in FIG. 18. For example, a high-speed interface SSD is used as a high-speed layer (higher layer). For example, a low-speed interface SSD or a high-speed HDD is used as a medium-speed layer (medium layer). For example, a low-speed HDD is used as a low-speed layer (lower layer).

In the hierarchical storage architecture as in the comparative example, however, physical device and interface are different depending on layer. Therefore, it is impossible to increase the speed of a specified storage device. In addition, even if data required to be frequently accessed is stored in the high-speed layer (higher layer), accesses do not necessarily center on only the data stored in the higher layer. As described above, the information processing system of the comparative example has a disadvantage that the efficiency of the whole system is hardly improved after forming the hierarchical structure.

[11] Eleventh Embodiment (Case where Storage Device Determines its Own Performance)

Figure 19:
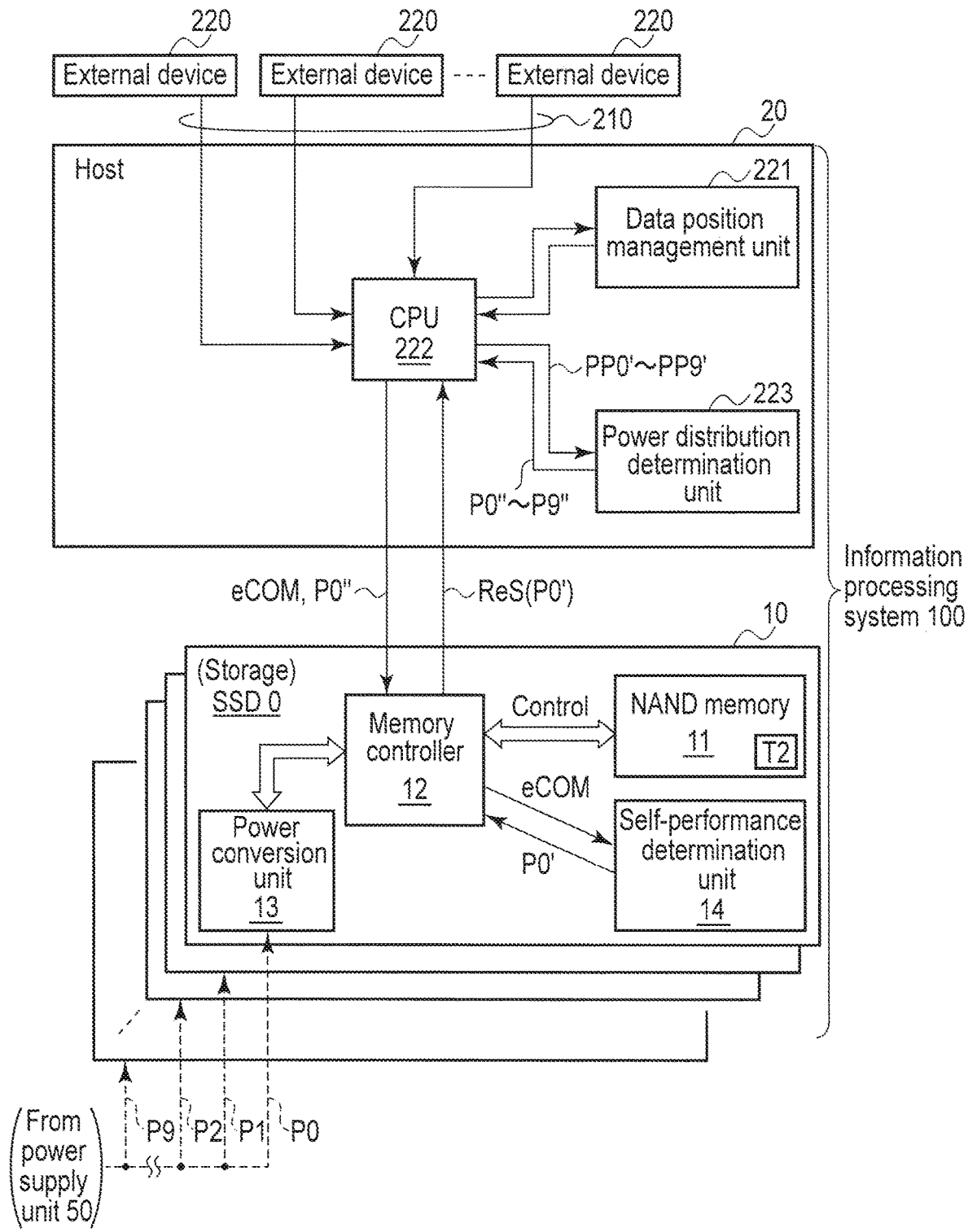
FIG. 19 is a block diagram showing a detailed structure of a information processing system according to the eleventh embodiment.
Figure 20:
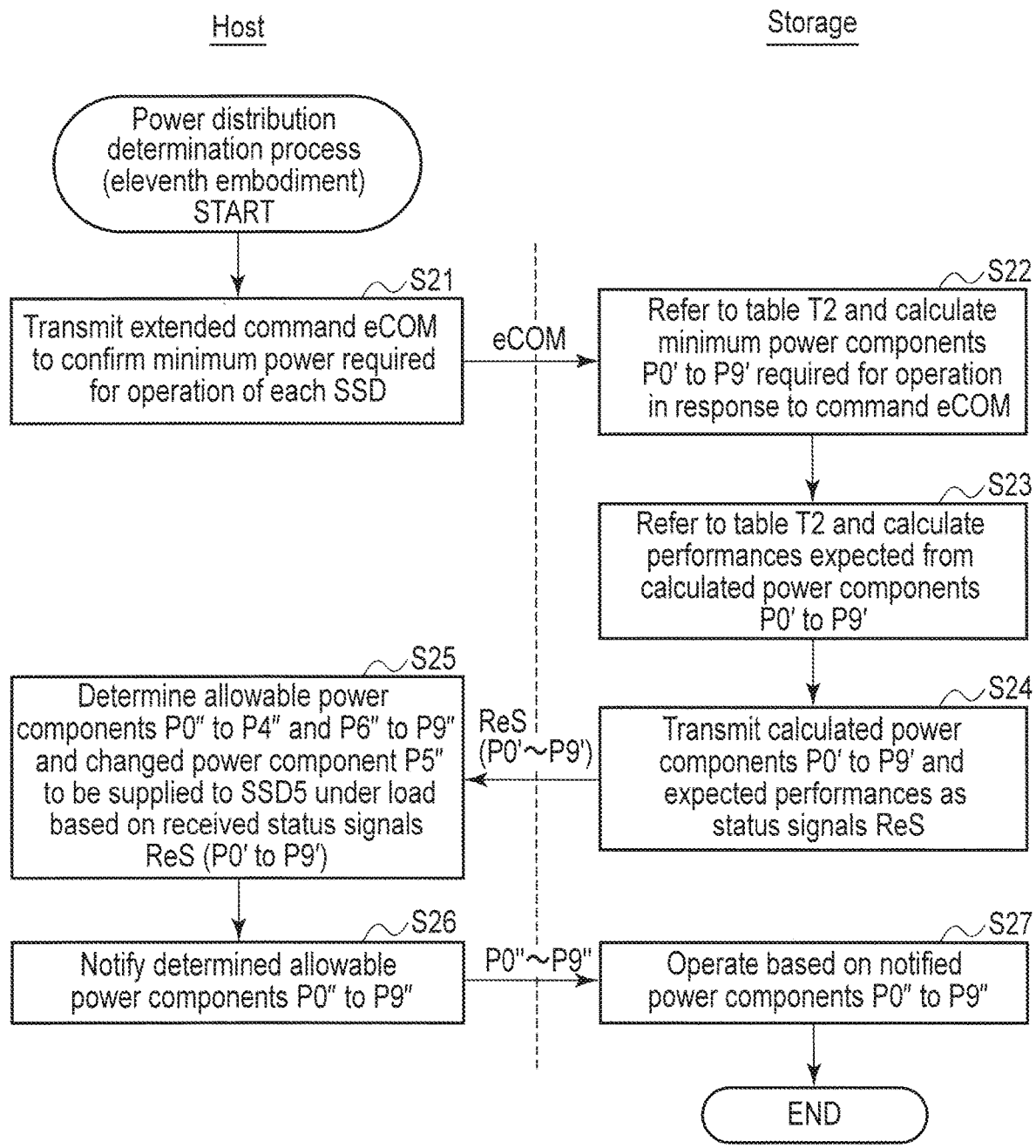
FIG. 20 is a flowchart showing a power distribution determination process according to the eleventh embodiment.

Next, the eleventh embodiment is described with reference to FIG. 19 and FIG. 20. The eleventh embodiment relates to a case where each storage device determines its own performance. In the description below, the description overlapping the tenth embodiment is omitted.

[Structure]
[Information Processing System]

The detailed structure of the information processing system 100 of the eleventh embodiment is described with reference to FIG. 19. As shown in FIG. 19, the information processing system 100 of the eleventh embodiment is different from that of the tenth embodiment in that the NAND memory 11 comprises a table T2 and each storage device 10 comprises a self-performance determination unit 14.

In table (second table) T2 of the NAND memory 11, an actual characteristic (PP0' to PP9') of the storage device 10 is stored. For example, actual characteristic PP0' of SSD0 is stored in table T2 of SSD0. Table T2 is updated by the memory controller 12 at arbitrary intervals. The storage location of table T2 is not limited to the NAND memory 11.

The self-performance determination unit 14 determines the performance of the storage device 10 under the control of the memory controller 12 and notifies the memory controller 12 of a result of the determination. For example, when receiving a command eCOM, the self-performance determination unit 14 of SSD0 refers to table T2 and determines the minimum power component P0' required for the operation of SSD0 based on the actual characteristic PP0'. The self-performance determination unit 14 of SSD0 further notifies the memory controller 12 of the determined power component P0'.

Since the other structure is substantially the same as that of the tenth embodiment, the detailed description is omitted.

[Operation]
[Distribution Power Determination Process]

A distribution power determination process of the information processing system 100 of the eleventh embodiment having the above-described structure is described with reference to FIG. 20. The description below is based on the assumption that a specified SSD5 is intensively accessed by the external devices 220 and the CPU 222 of the host 20 determines that the larger load (larger power) is necessary for SSD5, as an example.

In step S21, the CPU 222 of the host 20 transmits an extended command eCOM to each storage device 10 to detect the minimum power required for the operation of each SSD.

In step S22, in response to the command eCOM, the self-performance determination unit 14 of each storage device 10 refers to table T2 and determines the minimum power component (P0' to P9') required for the operation based on the actual characteristic (PP0' to PP9') stored in table T2.

In step S23, the self-performance determination unit 14 of each storage device 10 refers to table T2 and calculates performance (S0' to S9') expected from the calculated power component (P0' to P9') based on the characteristic (PP0' to PP9').

In step S24, the memory controller 12 of each storage device 10 transmits the calculated power component (P0' to P9') and the expected performance (S0' to S9') to the host 20 as a status signal ReS.

In step S25, the power distribution determination unit 223 of the host 20 determines allowable power components P0" to P4" and P6" to P9" and power component P5" changed to be supplied to SSD5 under a load, based on the received status signals ReS (P0' to P9' and S0' to S9').

In step S26, the CPU 222 of the host 20 notifies the storage devices 10 of the determined power components P0" to P9".

In step S27, the storage devices 10 operate based on power components P0" to P9" notified by the host 20.

Since the other operation is substantially the same as that of the tenth embodiment, the detailed description is omitted.

Advantageous Effects

As described above, according to the structure and operation of the information processing system 100 of the eleventh embodiment, at least the same effect as the above-described effect (1) can be achieved. As described in the eleventh embodiment, each storage device 10 may determine its own performance and power consumption.

[12] Twelfth Embodiment (Case where Host Notifies Required Performance)

Next, the twelfth embodiment is described with reference to FIG. 21. The twelfth embodiment relates to a case where the host notifies each storage device of required performance. In the description below, the description overlapping the above-described embodiments is omitted.

[Structure and Operation]

As shown in FIG. 21, the information processing system 100 of the twelfth embodiment is different from the first and eleventh embodiments in that the host 20 further notifies each storage device 10 of required performance (S0" to Sn-1"). For example, as shown in FIG. 13, performance S0" is performance expected from the calculated power component P0" based on characteristic PP0'.

More specifically, in steps S14 and S15, the power distribution determination unit 223 of the host 20 calculates power components P0" to P9" based on characteristics PP0' to PP9'. Next, the power distribution determination unit 223 calculates performances S0" to S9" expected from the calculated power components P0" to P9" based on the characteristics PP0' to PP9'. The storage devices 10 are notified of the calculated performances S0" to S9" together with power components P0" to P9".

The host 20 may notify the storage devices 10 of the calculated performances S0" to S9" instead of power components P0" to P9". The performances S0" to S9" may be calculated by the storage devices 10 instead of the host 20.

Since the other structure and operation are substantially the same as those of the first and eleventh embodiments, the detailed description is omitted.

Advantageous Effects

As described above, according to the structure and operation of the information processing system 100 of the twelfth embodiment, at least the same effect as the above-described effect (1) can be achieved. In addition, according to the twelfth embodiment, the storage devices 10 can be directly controlled based on the required performances S0" to S9". Therefore, each required performance can be achieved more directly.

[13] Thirteenth Embodiment (Case where Total Amount of Supplied Power is Variable)

Next, the thirteenth embodiment is described with reference to FIG. 22. The thirteenth embodiment relates to a case where the total amount of supplied power Pmax is variable. In the description below, the description overlapping the above-described embodiments is omitted.

[Structure and Operation]

Figure 22:
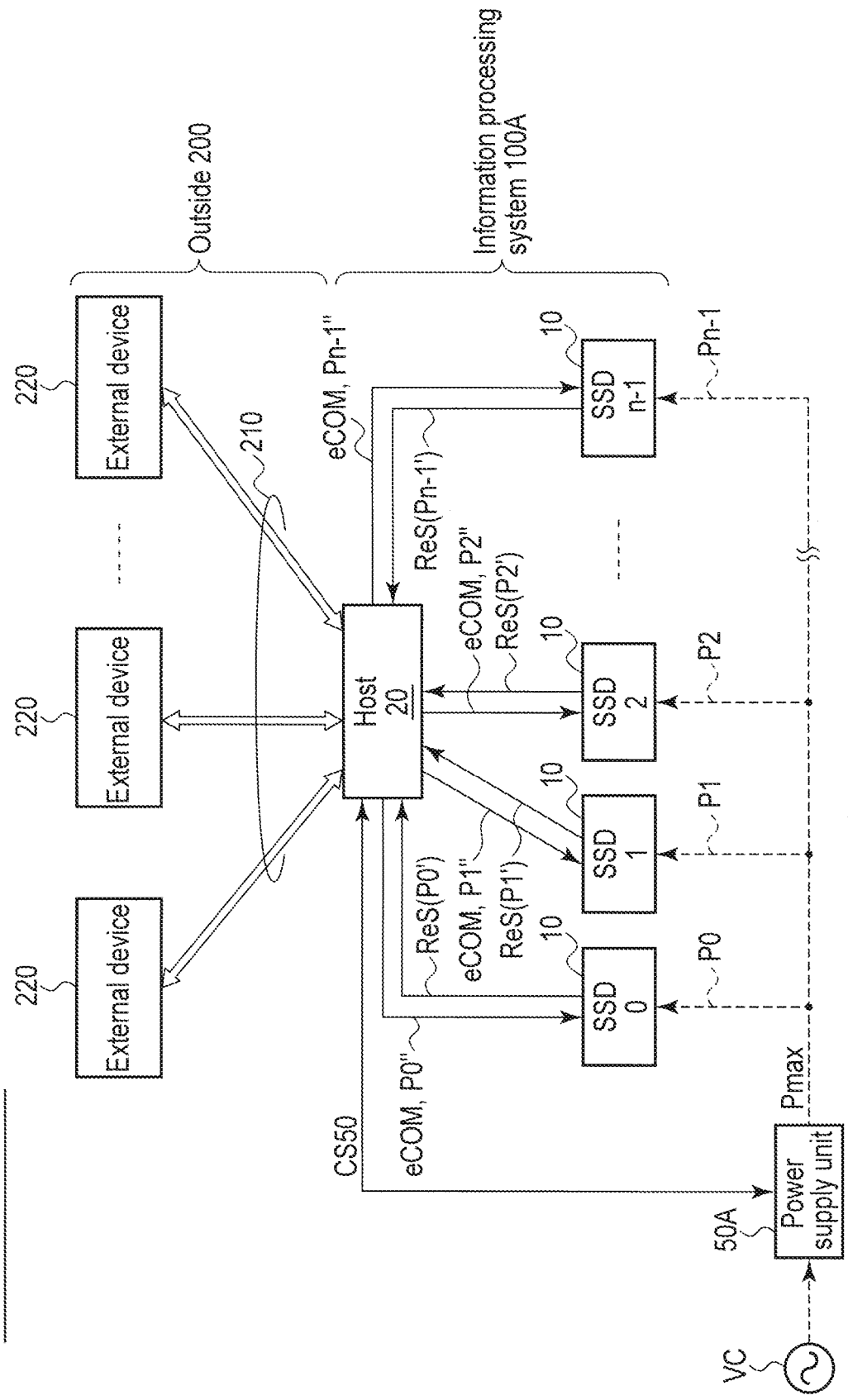
FIG. 22 is a block diagram showing a general structure of an information processing system according to the thirteenth embodiment.

As shown in FIG. 22, a information processing system 100A of the thirteenth embodiment is different from the first to twelfth embodiments in that a maximum value of total power Pmax supplied to the information processing system 100A can be varied by a control signal CS50 notified to a power supply unit 50A by the host 20.

For example, it is assumed that power supply unit 50A also supplies power to a information processing system 100B different from information processing system 100A. In such a case, when the operation of information processing system 100B is stopped, there is a surplus of power Pmax supplied from power supply unit 50A. Therefore, when detecting the surplus power, the CPU 222 of the host 20 transmits a control signal CS50 to power supply unit 50A to increase the maximum value of power Pmax. When receiving the control signal CS50, power supply unit 50A increases the maximum value of power Pmax and supplies information processing system 100A with the increased power under the control of the host 20.

Since the other structure and operation are substantially the same as those of the first to twelfth embodiments, the detailed description is omitted.

Advantageous Effects

As described above, according to the structure and operation of the information processing system 100A of the thirteenth embodiment, at least the same effect as the above-described effect (1) can be achieved. In addition, according to the thirteenth embodiment, the maximum value of total power Pmax supplied to information processing system 100A can be changed and the value of power Pmax can be increased by the control signal CS50 notified to the power supply unit 50A by the host 20. Therefore, the thirteenth embodiment has an advantage that the efficiency of the system can be further improved.

[14] Modified Example 1

The information processing system 100 is not limited to the first to thirteenth embodiments and may be changed as appropriate as described below.

[Structure and Operation]

The power consumption of the storage devices 10 is not necessarily determined by using the power/performance characteristics. For example, as shown in FIG. 23, a table (third table) T3 in which logs (operation history) of SSD0 to SSD9 constituting the storage devices 10 are recorded may be comprised. In table T3, power supplied to each of SSD0 to SSD9 constituting the storage devices and performance achieved by the power are recorded. For example, (S01, P01), (S02, P02), . . . are recorded as a log of SSD0. Logs of the other SSD1 to SSD9 are recorded in the same manner. The host 20 or the storage device 10 may determine predetermined power and performance from the characteristic by referring to table T3. Of course, both the characteristics and the logs may be used.

In addition, the first to third tables T1 to T3 are described as an example, but the form is not limited to a table form. For example, a predetermined formula, function and the like may be used.

The means for distributing power is not limited to supplying a specified storage device with surplus allowable power subtracted from the total power Pmax, and may be changed as necessary. For example, the host may distribute power to the storage devices 10 based on the status of all the storage devices 10 such that a specified process at a specified time is completed first.

The power consumed by the storage devices 10 is changed by not only the performance and the operation status of the storage devices 10 but also, for example, the environment (temperature, etc.) of the storage devices 10. Therefore, a temperature and an amount of heat of the storage devices 10 may also be detected as an index of the performance of the storage devices 10.

(Exterior)

Figure 24:
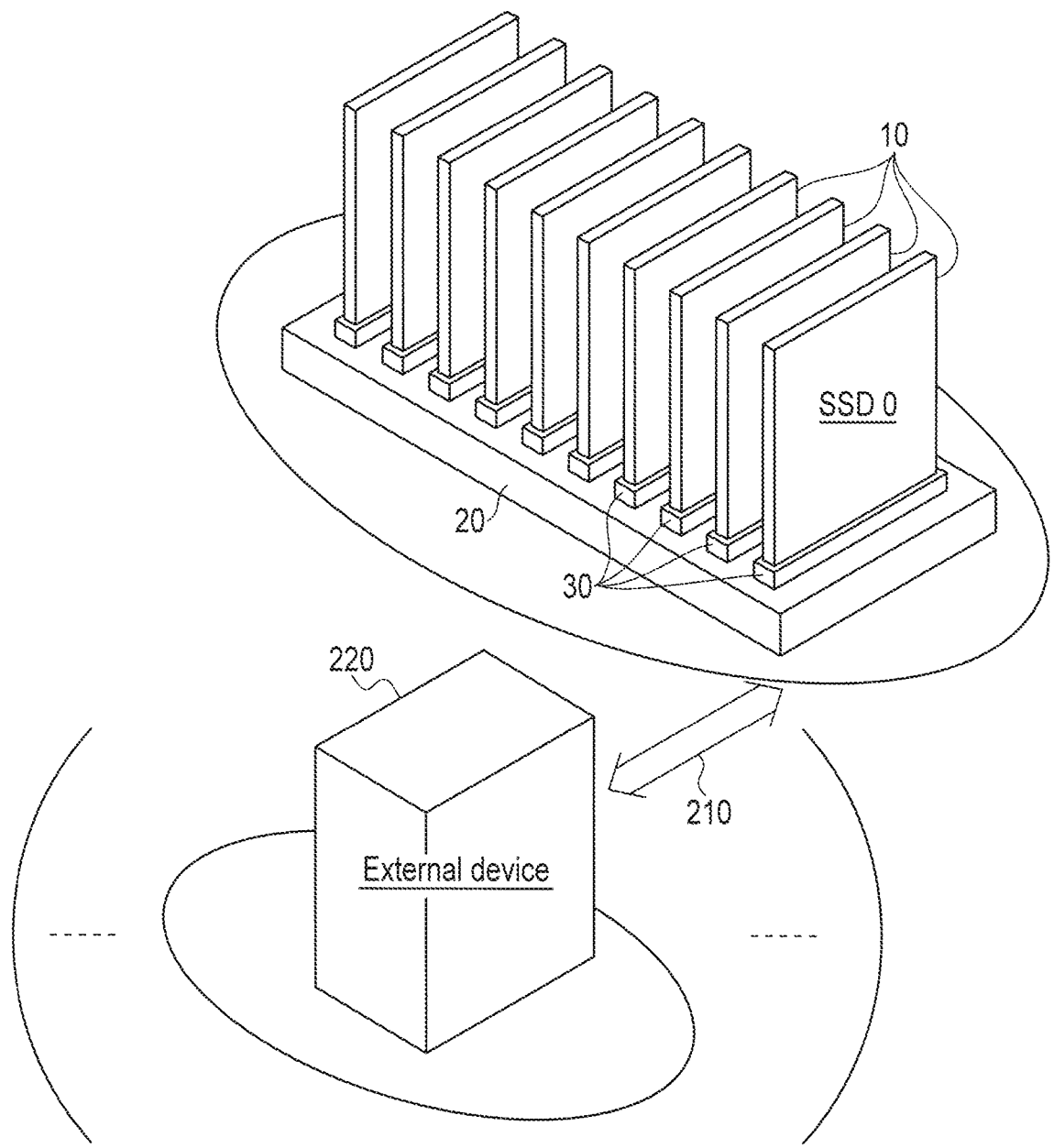
FIG. 24 is a perspective view showing an example of the exterior of the information processing system according to the first to thirteenth embodiments and modified example 1.

An example of the exterior of the information processing system which can be applied to the first to thirteenth embodiments and the modified example with reference to FIG. 24.

As shown in FIG. 24, the information processing system 100 comprises the storage devices 10 and the host 20 which controls the storage devices 10. SSDs are described as an example of the storage devices 10.

For example, the storage devices 10 can be attached to the host 20 in a data center and a cloud computing system of an enterprise. The storage devices can access an external device 220 such as an external server via the network 210 under the control of the host 20. Therefore, SSD0 to SSD9 may be enterprise SSDs (eSSDs).

The use of SSD0 to SSD9 is not limited for enterprises. For example, SSD0 to SSD9 can be of course applied as a storage medium of an electronic device for consumer such as a notebook computer and a tablet.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory;
   a first decoder configured to execute a first error correction for correcting data read from the nonvolatile memory;
   a second decoder configured to execute a second error correction for correcting data read from the nonvolatile memory, and
   a controller configured to
   receive a first command issued by a host device, the first command being a command that requests neither reading nor writing data from or to the nonvolatile memory and that includes information indicative of acceptable latency of error correction,
   in response to receiving the first command, select one of the first decoder and the second decoder based on the received first command,
   and
   after receiving the first command, output data read from the nonvolatile memory through the selected one of the first decoder and the second decoder to the host device.

2. The memory system of claim 1, wherein
   the controller is further configured to execute garbage collection on the nonvolatile memory in response to a second command issued by the host device, the second command being a command that does not request writing data to the nonvolatile memory.

3. The memory system of claim 1, wherein:
the nonvolatile memory includes different types of nonvolatile memories; and
the controller is further configured to select a type of nonvolatile memory for writing data from the different types of nonvolatile memories based on a third command issued by the host device, the third command being a command that requests writing data to the nonvolatile memory and including an attribute of the data to be written.

4. A host device configured to control a memory system including a nonvolatile memory, the host device comprising:
a controller configured to:
issue a first command to the memory system, the first command being a command that requests neither reading nor writing data from or to the nonvolatile memory and that includes information indicative of acceptable latency of error correction, and the first command further causing the memory system to select one of a first decoder and a second decoder, the first decoder executing a first error correction for correcting data read from the nonvolatile memory, the second decoder executing a second error correction for correcting data read from the nonvolatile memory, and the first command causing the memory system to output data read from the nonvolatile memory through the selected one of the first decoder and the second decoder to the host device.

5. The host device of claim 4, wherein the controller is further configured to issue a second command to the memory system for causing the memory system to execute garbage collection on the nonvolatile memory, the second command being a command that does not request writing data to the memory system.

6. The host device of claim 4, wherein:
the nonvolatile memory includes different types of nonvolatile memories; and
the controller is further configured to issue a third command to the memory system, the third command being a command that requests writing data to the memory system, including an attribute of the data to be written, and causing the memory system to select a type of nonvolatile memory for writing data from the different types of nonvolatile memories.

7. An information processing system comprising:
a memory system including:
a nonvolatile memory;
a first decoder configured to execute a first error correction for correcting data read from the nonvolatile memory; and
a second decoder configured to execute a second error correction process for correcting read data from the nonvolatile memory; and
a host device configured to control the memory system, wherein:
the host device is configured to issue a first command to the memory system, the first command being a command that requests neither reading or writing data from or to the nonvolatile memory and that includes information indicative of acceptable latency of error correction, and wherein:

the memory system is configured to:
receive the first command from the host device,
in response to receiving the first command, select one of the first decoder and the second decoder based on the received first command,
and
after receiving the first command, output data read from the nonvolatile memory through the selected one of the first decoder and the second decoder to the host device.

8. The information processing system of claim 7, wherein:
the host device is further configured to issue a second command to the memory system, the second command being a command that does not request writing data to the memory system; and
the memory system is further configured to execute garbage collection on the nonvolatile memory in response to the second command.

9. The information processing system of claim 7, wherein:
the nonvolatile memory includes different types of nonvolatile memories;
the host device is further configured to issue a third command to the memory system, the third command being a command that requests writing data to the memory system and including an attribute of the data to be written; and
the memory system is configured to select a type of nonvolatile memory for writing data from the different types of nonvolatile memories based on the received third command.

10. The memory system of claim 2, wherein the controller is further configured to stop the garbage collection when writing data to the nonvolatile memory is required from the host device while the garbage collection is in progress, and to resume the garbage collection after the writing data to the nonvolatile memory is completed.

11. The memory system of claim 3, wherein the third command includes information indicative of update frequency of data to be written to the selected type of the nonvolatile memories.

12. The memory system of claim 3, wherein:
the different types of nonvolatile memories include a single-level cell (SLC) and a multi-level cell (MLC); and
the controller is further configured to select the SLC from the different types of nonvolatile memories when data to be written to the nonvolatile memory is meta data, and to select the MLC from the different types of nonvolatile memories when data to be written to the nonvolatile memory is user data.

13. The host device of claim 4, wherein the controller is further configured to control a plurality of memory systems including the memory system, and to read data from another memory system in the plurality of memory systems when an error occurs upon reading data from the memory system.

14. The host device of claim 5, wherein the controller is further configured to cause the memory system to stop the garbage collection when writing data to the memory system while the garbage collection is in progress in the memory system, and to cause the memory system to resume the garbage collection after the writing data to the memory system is completed.

15. The host device of claim 6, wherein the third command includes information indicative of update frequency of data to be written to the selected type of nonvolatile memory.

16. The host device of claim 6, wherein:
the different types of nonvolatile memories include a single-level cell (SLC) and a multi-level cell (MLC); and
the controller is further configured to cause the memory system to select the SLC from the different types of nonvolatile memories when data to be written the memory system is meta data, and to cause the memory system to select the MLC from the different types of nonvolatile memories when data to be written to the memory system is user data.

17. The information processing system of claim 7, wherein the host device is further configured to control a plurality of memory systems including the memory system, and to read data from another memory system in the plurality of memory systems when an error occurs upon reading data from the memory system.

18. The information processing system of claim 8, wherein the host device is further configured to cause the memory system to stop the garbage collection when writing data to the memory system while the garbage collection is in progress in the memory system, and to cause the memory system to resume the garbage collection after the writing data to the memory system is completed.

19. The information processing system of claim 9, wherein the third command includes information indicative of update frequency of data to be written to the selected type of nonvolatile memory.

20. The information processing system of claim 9, wherein:
the different types of nonvolatile memories include a single-level cell (SLC) and a multi-level cell (MLC); and
the host device is further configured to cause the memory system to select the SLC from the different types of nonvolatile memories when data to be written to the memory system is meta data, and to cause the memory system to select the MLC from the different types of nonvolatile memories when data to be written to the memory system is user data.

* * * * *